US011923213B2

(12) United States Patent
Kim et al.

(10) Patent No.: US 11,923,213 B2
(45) Date of Patent: Mar. 5, 2024

(54) SUBSTRATE HEATING UNIT, SUBSTRATE PROCESSING APPARATUS, AND SUBSTRATE PROCESSING METHOD

(71) Applicant: SEMES CO., LTD., Cheonan-si (KR)

(72) Inventors: Tae Shin Kim, Suwon-si (KR); Young Dae Chung, Incheon (KR); Ji Hoon Jeong, Hwaseong-si (KR); Jee Young Lee, Incheon (KR); Won Geun Kim, Goyang-si (KR)

(73) Assignee: SEMES CO., LTD., Cheonan-si (KR)

( * ) Notice: Subject to any disclaimer, the term of this patent is extended or adjusted under 35 U.S.C. 154(b) by 492 days.

(21) Appl. No.: 17/128,159

(22) Filed: Dec. 20, 2020

(65) Prior Publication Data

US 2021/0202280 A1 Jul. 1, 2021

(30) Foreign Application Priority Data

Dec. 26, 2019 (KR) ......................... 10-2019-0175714

(51) Int. Cl.
| | |
|---|---|
| *H01L 23/00* | (2006.01) |
| *B08B 3/10* | (2006.01) |
| *B23K 26/00* | (2014.01) |
| *B23K 26/06* | (2014.01) |
| *B23K 26/064* | (2014.01) |
| *B23K 26/352* | (2014.01) |
| *G02B 7/02* | (2021.01) |
| *G02B 27/09* | (2006.01) |
| *H01L 21/02* | (2006.01) |

(Continued)

(52) U.S. Cl.
CPC .......... *H01L 21/67115* (2013.01); *B08B 3/10* (2013.01); *B23K 26/0006* (2013.01); *B23K 26/0604* (2013.01); *B23K 26/0626* (2013.01); *B23K 26/064* (2015.10); *B23K 26/352* (2015.10); *G02B 7/028* (2013.01); *G02B 27/0916* (2013.01); *G02B 27/0955* (2013.01); *H01L 21/02057* (2013.01); *H01L 21/268* (2013.01); *H01L 21/67051* (2013.01); *H01L 21/67248* (2013.01); *H01L 21/68764* (2013.01); *H01L 22/20* (2013.01); *B23K 2101/40* (2018.08); *B23K 2103/56* (2018.08)

(58) Field of Classification Search
CPC ......... H01L 21/67115; H01L 21/02057; H01L 21/268
See application file for complete search history.

(56) References Cited

U.S. PATENT DOCUMENTS

| | | |
|---|---|---|
| 2004/0069751 A1 | 4/2004 | Yamazaki |
| 2016/0116679 A1 | 4/2016 | Muendel et al. |

(Continued)

FOREIGN PATENT DOCUMENTS

| | | |
|---|---|---|
| JP | 2015-500571 | 1/2015 |
| JP | 2016-001642 | 1/2016 |

(Continued)

OTHER PUBLICATIONS

1 Office Action from the China National Intellectual Property Administration dated Oct. 30, 2023.

*Primary Examiner* — Anthony Ho

(57) ABSTRACT

Proposed is a substrate heating unit including: a laser generator providing a laser beam for heating a substrate; and a beam shaper processing the laser beam from the laser generator and selectively providing one of a first beam having a uniform energy distribution and a second beam having an edge-enhanced energy distribution to the substrate.

17 Claims, 12 Drawing Sheets

(51) Int. Cl.
*H01L 21/268* (2006.01)
*H01L 21/66* (2006.01)
*H01L 21/67* (2006.01)
*H01L 21/687* (2006.01)
*B23K 101/40* (2006.01)
*B23K 103/00* (2006.01)

(56) References Cited

U.S. PATENT DOCUMENTS

2018/0117641 A1  5/2018  Jung et al.
2019/0148134 A1  5/2019  Emoto et al.

FOREIGN PATENT DOCUMENTS

| KR | 10-2016-0027802 | 10/2016 |
| KR | 10-2018-0049310 | 5/2018 |
| KR | 10-2019-0029825 | 3/2019 |
| KR | 10-2019-0075875 | 7/2019 |
| WO | 2013191421 | 12/2013 |

MAIN PLANE

SUBSTRATE HEATING UNIT, SUBSTRATE PROCESSING APPARATUS, AND SUBSTRATE PROCESSING METHOD

CROSS REFERENCE TO RELATED APPLICATION

The present application claims priority to Korean Patent Application No. 10-2019-0175714, filed on Dec. 26, 2019, the entire contents of which are herein incorporated by reference.

BACKGROUND OF THE INVENTION

Field of the Invention

The present disclosure relates to a unit that is used to heat a substrate when processing the substrate. In addition, the present disclosure relates to an apparatus and a method that processes a substrate using this unit.

Description of the Related Art

Various processes are performed to manufacture semiconductors, flat-panel displays (FPD), and the like. For example, in order to process substrates, such as wafers, a photoresist coating process, a developing process, an etching process, an asking process, and the like are performed. In addition, in order to remove contaminants attached to the substrates during these processes, a wet cleaning process of cleaning the substrates using processing liquid, a drying process of removing the processing liquid remaining on the substrates, and the like are performed.

A recent trend is to perform the etching process of selectively removing silicon nitride, silicon oxide film, or the like using the processing liquid, such as sulfuric acid, and phosphoric acid, that is used in a high temperate state. In order to improve an etching rate, substrate processing apparatuses each include a substrate heating unit that heats the substrate. Thus, while performing the processes, the substrate can be heated to a required temperature.

However, when etching the substrate with high temperature processing liquid, it is difficult to uniformly heat the entire substrate using a substrate heating unit in the related art. Furthermore, the entire substrate cannot be maintained at a uniform temperature in terms of using the high temperature processing liquid.

FIG. 1 is a graph showing a distribution of temperature of the substrate when processing the substrate in the related art. In FIG. 1, C denotes a central point of the substrate, E1 and E2 denote opposite points on an edge of the substrate. The high temperature processing liquid is supplied to the center of the substrate and is spread toward the edge of the substrate. Thus, temperature of the center of the substrate is relatively high. As the edge thereof is approached, the temperature of the edge is relatively lower.

In this manner, when the temperature of the substrate is not uniform, the etching rate varies according to a temperature range. This causes defective substrates during the processes.

The foregoing is intended merely to aid in the understanding of the background of the present disclosure, and is not intended to mean that the present disclosure falls within the purview of the related art that is already known to those skilled in the art.

DOCUMENT OF RELATED ART

Patent Documents (Patent Document 1) Korean Patent Application Publication No. 10-2016-0027802 (2016 Mar. 10)
(Patent Document 2) Korean Patent Application Publication No. 10-2018-0049310 (2018 May 11)
(Patent Document 3) Korean Patent Application Publication 10-2019-0075875 (2019 Jul. 1)

SUMMARY OF THE INVENTION

An objective of the present disclosure is to provide a substrate heating unit, a substrate processing apparatus, and a substrate processing method that are capable of heating a substrate in a more uniform manner when processing the substrate.

Another objective of the present disclosure is to provide a substrate heating unit, a substrate processing apparatus, and a substrate processing method that are capable of minimizing a temperature deviation of a substrate when processing the substrate.

Still another objective of the present disclosure is to provide a substrate heating unit, a substrate processing apparatus, and a substrate processing method that are capable of uniformly heating a substrate using a laser beam.

No limitation is imposed to the objectives. From the following description, other objectives will be apparent to a person of ordinary skill in the art.

According to an exemplary embodiment of the present invention, a substrate heating unit includes a laser generator configured to generate a first laser beam which is directed toward a substrate, and a beam shaper configured to reshape an energy distribution of the first laser beam received from the laser generator to selectively provide the substrate with a second laser beam having one of a uniform energy distribution over the substrate and an edge-enhanced energy distribution in which a first portion of the second laser beam is directed toward an edge portion of the substrate, and a second portion of the second laser beam is directed toward a central portion of the substrate. The first portion of the second laser beam has an energy intensity higher than an energy intensity of the second portion of the second laser beam.

The beam shaper includes a lens assembly configured to divide the first laser beam into a plurality of beams, and a condensing lens configured to converge the plurality of laser beams on the substrate. The lens assembly is disposed between the laser generator and the condensing lens. The lens assembly includes a first lens array and at least one second lens array. The first lens array and the at least one second lens array are positioned such that an optical axis of the first lens array and an optical axis of the at least one second lens are aligned with each other. The first lens array is positioned at a fixed position and is closer to the laser generator than the at least on second lens array. The at least one second lens array is configured to be movable along the optical axis of the first lens array to generate the second laser beam having a circular shape with a diameter which is substantially the same as a diameter of the substrate.

The beam shaper further includes a lens drive mechanism configured to move the at least one second lens array.

The substrate heating unit further includes a temperature detector configured to measure a distribution of temperature of the substrate, and a controller configured to control operation of the lens drive mechanism on the basis of the distribution of the temperature of the substrate.

The at least one second lens array is provided between the first lens array and the condensing lens.

The first lens array, the at least one second lens array, and the condensing lens are positioned such that an optical axis of the first lens array, an optical axis of the at least one second lens array, and an optical axis of the condensing lens are aligned with each other to a common optical axis.

The at least one second lens array includes a first movable lens array. The first movable lens array is controlled such that the first movable lens array is positioned at one of a first position that satisfies the following equation, and a second position that does not satisfy the following equation:

$$d_{12}=f_2,$$ [Equation]

where $d_{12}$ is a distance between the first lens array and the first movable lens array along the optical axis of the first lens array, and $f_2$ is a focal length of the first movable lens array.

The at least one second lens array includes a first movable lens array that is provided between the first lens array and the condensing lens, and a second movable lens array that is provided between the second lens array and the condensing lens.

The first lens array, the first movable lens array, the second movable lens array, and the condensing lens are positioned such that the optical axis of the first lens array, an optical axis of the first movable lens array, an optical axis of the second movable lens array, and an optical axis of the condensing lens are aligned with each other to a common optical axis.

The first movable lens array and the second movable lens array are controlled such that the first movable lens array is positioned at one of a first position that satisfies an equation 1, and a second position that does not satisfy the equation 1, wherein the equation 1 is expressed as $$d_{12} = \frac{f_2(f_3 - d_{23})}{f_2 + f_3 - d_{23}},$$

where $d_{12}$ is a distance between the first lens array and the first movable lens array, $f_2$ is a focal length of the first movable lens array, and $f_3$ is a focal length of the second movable lens array. The second movable lens array is positioned at one of a third position that satisfies an equation 2, and a fourth position that does not satisfy the equation 2, wherein the equation 2 is expressed as $$d_{23} = \frac{f_2 f_3 - d_{12}(f_2 + f_3)}{f_2 - d_{12}},$$

where $d_{23}$ is a distance between the first movable lens array and the second movable lens array.

Each of the first lens array and the at least one second lens array includes a plurality of lenslets. The plurality of lenslets are arranged to fill a region having a shape corresponding to a shape of the substrate.

According to an exemplary embodiment of the present invention, a substrate processing apparatus includes a substrate support unit configured to support a substrate, and provided with an exposure opening through which a lower surface of the supported substrate is exposed, and a substrate heating unit configured to heat the substrate supported by the substrate support unit. The substrate heating unit includes a laser generator configured to generate a first laser beam which is directed toward a substrate, and a beam shaper configured to shape an energy distribution of the first laser beam received from the laser generator to selectively provide the substrate with a second laser beam having one of a uniform energy distribution over the substrate and an edge-enhanced energy distribution in which a first portion of the second laser beam is directed toward an edge portion of the substrate, and a second portion of the second laser beam is directed toward a central portion of the substrate. The first portion of the second laser beam has an energy intensity higher than an energy intensity of the second portion of the second laser beam. The second laser beam irradiates on the lower surface of the substrate through the exposure opening of the substrate support unit.

The beam shaper includes a lens assembly configured to divide the first laser beam into a plurality of beams, and a condensing lens configured to converge the plurality of laser beams on the substrate. The lens assembly includes a plurality of lens arrays positioned along a common optical axis. The plurality of lens arrays includes at least one movable lens array which is configured to be movable along the common optical axis and generate the second laser beam having a circular shape with a diameter which is substantially the same as a diameter of the substrate.

The substrate processing apparatus further includes a distance adjustment unit configured to adjust a distance between the substrate and the beam shaper.

The substrate support unit includes a head on which the substrate is provided, the head having the exposure opening therein, and a substrate chuck coupled to the head. The substrate chuck includes a plurality of chuck pins on a top surface of the head and in the vicinity of the exposure opening. The plurality of chuck pins are configured to support a lateral surface of the substrate.

The head includes a head body provided with the exposure opening, the exposure opening extending from a bottom surface of the head body toward a top surface of the head body which corresponds to the top surface of the head, and a support plate covering an upper end of the exposure opening. The support plate is made of a material transmitting the second laser beam and is provided with a plurality of support pins which are configured to support the lower surface of the substrate.

The head corresponds to a spin head that is rotated by a rotation drive unit and is vertically moved by an ascending/descending-enabling drive unit. The rotation drive unit includes a head support member positioned under the spin head, which rotatably supports the spin head and has a beam passage in a vertical direction, the beam passage being connected to the exposure opening. The ascending/descending-enabling drive unit includes a housing configured to support the head support member, the housing an opening on top, wherein the beam shaper is accommodated in the housing, wherein the opening of the housing is connected to the beam passage, and wherein the second beam of the beam shaper irradiates the lower surface of the substrate via the opening of the housing, the beam passage, and the exposure opening which are connected to each other, and a housing driver configured to ascend or descend the housing.

According to an exemplary embodiment of the present invention, a substrate processing method includes supplying a processing liquid to an upper surface of a substrate, processing the substrate with the processing liquid, and irradiating a laser beam on the substrate, thereby heating the substrate during a time when the substrate is being processed with the processing liquid. The irradiating of the laser beam on the substrate includes shaping an energy distribution of the laser beam to have one of a uniform energy distribution over the substrate and an edge-enhanced energy distribution in which a first portion of the laser beam is directed toward an edge portion of the substrate, and a second portion of the laser beam is directed toward a central portion of the substrate. The first portion of the first laser beam has an energy intensity higher than an energy intensity of the second portion of the laser beam.

The substrate processing method further includes measuring a distribution of temperature of the substrate during the time when the substrate is being processed with the processing liquid. The shaping of the energy distribution is performed according to the measured distribution of the temperature of the substrate.

The laser beam is irradiated on the lower surface of the substrate.

The embodiments will be more apparent from the following description and the accompanying drawings. In addition, various other embodiments will be available from the following description.

According to the embodiment of the present disclosure, one of the first beam (the overall uniform flat top laser beam) having the uniform energy distribution and the second beam (the edge-enhanced flat top laser beam) having an edge-enhanced energy distribution is selectively to the substrate when processing the substrate.

Therefore, the entire substrate can be heated to a uniform temperature by providing the first beam to the substrate. In addition, in a case where temperature of the edge of the temperature is relatively low, temperature deviation of the substrate can be minimized by providing the second beam.

The effects, features, and objectives of the present disclosure are not limited to the ones mentioned above, and other effects, features, and objectives not mentioned above can be clearly understood by those skilled in the art from the following description.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION OF THE INVENTION

Figure 1:
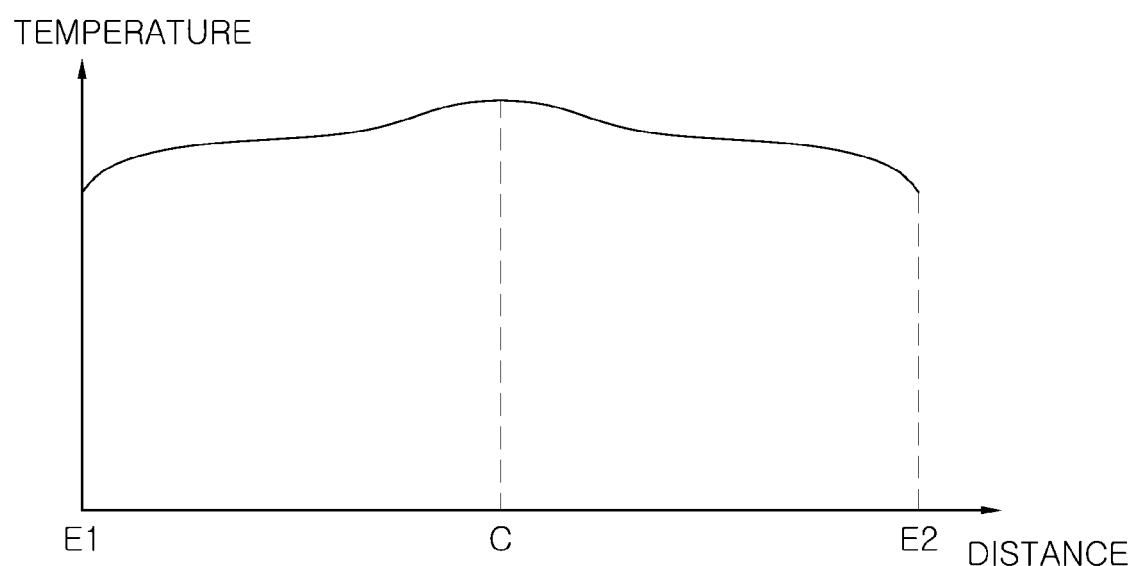
FIG. 1 is a graph showing a distribution of temperature of a substrate when processing a substrate in the related art.

Embodiments of the present disclosure will be described in detail below with reference to the accompanying drawings in such a manner that a person of ordinary skill in the art to which the present disclosure pertains is enabled to make or utilize the present disclosure without undue experimentation. Various embodiments of the present disclosure can be made operative and should not be construed to being limited to embodiments that will be described below.

If detailed descriptions of functions and configurations known in the related art will unnecessarily make the nature and gist of the present disclosure unapparent, the detailed descriptions thereof are omitted. Constituent elements that perform the same or similar functions or operations are given the same or similar reference characters throughout all the drawings.

At least one or several of the terms that are used in the specification are defined by considering functions for which such terms are used according to the present disclosure and may vary according to the common practices in the art. Therefore, the meanings of the terms should be construed in light of the specification. When the expression "includes a constituent element" is used throughout the specification, unless otherwise particularly described, this expression means "further includes any other constituent element, not "excludes any other constituent element". In addition, when a constituent element is referred to as being connected to (or combined with) one other constituent element, this constituent element may be directly connected to (or combined with) one other constituent element or may be indirectly connected to (or combined with) one other constituent with an intervening constituent element in between.

For the convenience of understanding, a size or shape of a constituent element, the thickness of line, and the like may be illustrated in an exaggerated manner in the drawings.

A substrate heating unit according to the present disclosure used to heat a substrate while performing various substrate processing processes of a semiconductor, a flat-panel display, and the like. According to an embodiment of the present disclosure, a substrate processing apparatus is a liquid processing apparatus that processes a substrate using processing liquid. The substrate heating unit that finds application in the liquid processing apparatus will be described in detail below.

Figure 2:
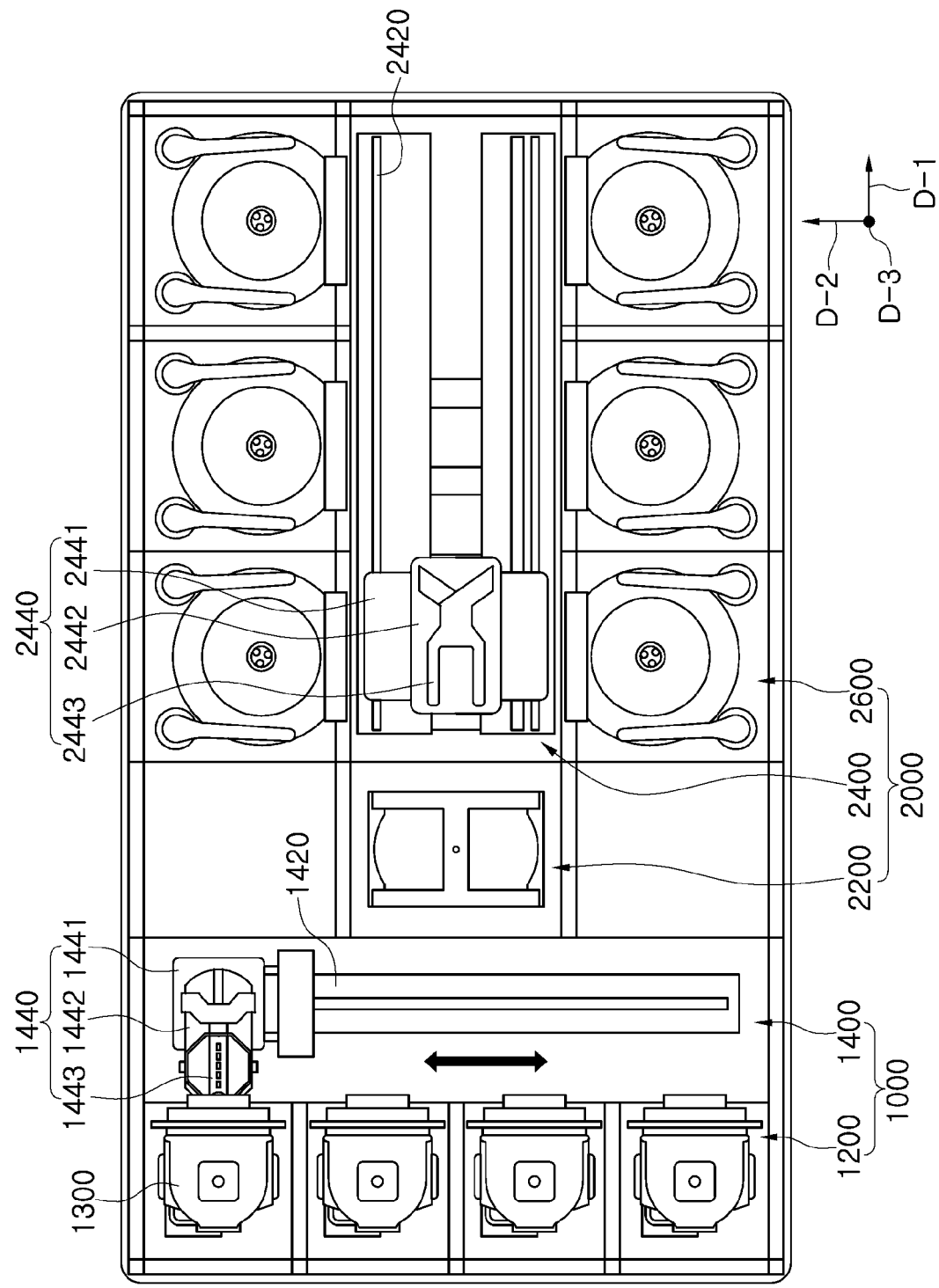
FIG. 2 is a plan view schematically illustrating a configuration of substrate processing equipment in which a substrate processing apparatus according to the present disclosure finds application.

FIG. 2 is a plan view schematically illustrating a configuration of substrate processing equipment in which the substrate processing apparatus according to the present disclosure finds application. As illustrated in FIG. 2, the substrate processing equipment includes an index module 1000 and a processing module 2000.

The index module 1000 includes a load port 1200 and an index unit 1400. The load port 1200, the index unit 1400, and the processing module 2000 are positioned in this order in a row. A direction in which the load port 1200, the index unit 1400, and the processing module 2000 are positioned is hereinafter referred to as a first direction D-1. Furthermore, a direction that is perpendicular to the first direction D-1 when viewed from above is referred as a second direction, and a direction that is perpendicular to a plane formed by the first direction D-1 and the second direction D-2 is referred to as a third direction.

A cassette 1300 that accommodates the substrate is stably placed in the load port 1200. A plurality of the load ports 1200 are positioned in a low along the second direction D-2. FIG. 2 illustrates that four ports 1200 are present. The number of the load ports 1200 is increased or decreased according to operating conditions, such as the processing efficiency of the processing module 2000, and a footprint. The cassette 1300 is placed within the load port 1200 by a cassette transportation unit, such as an overhead transfer. The cassette 1300 has a slot inside. The slot supports an edge of the substrate. A plurality of the slots in the cassettes 1300 are provided in the third direction D-3. A plurality of the substrates are positioned a distance away for each other along the third direction D-3. The substrate is accommodated within the cassette 1300. As the cassette 1300, a front opening unified pod (FOUP) is used.

The processing module 2000 includes a buffer unit 2200, a transportation unit 2400, and a process chamber 2600. The transportation unit 2400 is positioned in such a manner that a lengthwise direction thereof is in parallel with the first direction D-1. The process chambers 2600 are positioned along the second direction D-2 to each of both sides of the transportation unit 2400. The process chambers 2600 are provided to each of both sides of the transportation unit 2400 in a manner that is positioned symmetrically with respect to the transportation unit 2400. Some of the process chambers 2600 are positioned along the first direction D-1 that is a lengthwise direction of the transportation unit 2400. Some of the process chamber 2600 are stacked on top of each other. That is, the process chambers 2600 are positioned in an array of A×B (A and B are natural numbers that are equal to or greater than 1) to at least one of both sides of the transportation unit 2400. A is the number of the process chambers 2600 provided in a row along the first direction D-1, and B is the number of the process chambers 2600 provided in a row along the third direction D-3. In a case where 4 or 6 process chambers 2600 are provided to at least one of both sides of the transportation unit 2400, the process chamber 2600 are positioned in an array of 2×2 or 3×2. The number of the process chambers 2600 may be increased or decreased. Alternatively, the process chambers 2600 may be provided to only one of both sides of the transportation unit 2400.

The buffer unit 2200 is positioned between the index unit 1400 and the transportation unit 2400. The buffer unit 2200 provides a space between the index unit 1400 and the transportation unit 2400. In the space, the substrate stays before being transported. The buffer unit 2200 has a slot inside. The substrate is placed in the slot. A plurality of the slots in the buffer units 2200 are positioned a distance away from each other along the third direction D-3. The buffer unit 2200 has an opening facing the index unit 1400 and an opening facing the transportation unit 2400.

The index unit 1400 transports the substrate between the cassette 1300 and the buffer unit 2200. An index rail 1420 and an index robot 1440 are provided to the index unit 1400. The index rail 1420 is provided in such a manner that a lengthwise direction thereof is in parallel with the second direction D-2. The index robot 1440 is installed on the index rail 1420 and is moved in the second direction D-2 along the index rail 1420. The index robot 1440 includes a base 1441, a body 1442, and an index arm 1443. In the index robot 1440, the base 1441 is installed in a manner that is movable along the index rail 1420, and the body 1442 is combined with the base 1441. In the index robot 1440, the body 1442 is provided in a manner that is movable along the third direction D-3 on the base 1441 and in a manner that is rotatable about an axis in the third direction D-3 on the base 1441. In the index robot 1440, the index arm 1443 is combined with the body 1442 in a manner that is movable backward and forward with respect to the body 1442. A plurality of the index arms 1443 are provided in a manner that is individually driven. The index arms 1443 are positioned a distance away from each other along the third direction D-3. Some of the index arms 1443 are used to transport the substrate from the processing module 2000 to the cassette 1300, and others are used to transport the substrate from the cassette 1300 to the processing module 2000. While the index robot 1440 carries in and carries out the substrate, this configuration prevents particles, occurring from the pre-processing substrate, from being attached to the post-processing substrate.

The transportation unit 2400 transports the substrate between the buffer unit 2200 and the process chamber 2600 and between the process chambers 2600. A transportation rail 2420 and a transportation robot 2440 are provided to the transportation unit 2400. The transportation rail 2420 is positioned in such a manner that a lengthwise direction thereof is in parallel with the first direction D-1. The transportation robot 2440 is installed on the transportation rail 2420 and is moved the first direction D-1 along the transportation rail 2420. The transportation robot 2440 includes a base 2441, a body 2442, and a transportation arm 2443. In the transportation robot 2440, the base 2441 is installed in a manner that is movable along the transportation rail 2420, and the body 2442 is combined with the base 2441. In the transportation robot 2440, the body 2442 is provided in a manner that is movable along the third direction D-3 on the base 2441 and in a manner that is rotatable about the axis in the third direction D-3 on the base 2441, In the transportation robot 2440, the transportation arm 2443 is combined with the body 2442 in a manner that is movable backward and forward with respect to the body 2442. A plurality of the transportation arms 2443 are provided in a manner that is individually driven. The transportation arms 2443 are positioned a distance away from each other along the third direction D-3. The transportation arms 2443 used when transporting the process chambers 2600 from the buffer unit 2200 is different from that used when transporting the substrate from the process chambers 2600 to the buffer unit 2200.

The process chamber 2600 includes the substrate processing apparatus performing the substrate processing process.

The substrate processing apparatus of each of the process chambers 2600 has a structure that varies according to a type of process to be performed. The substrate processing apparatus of each of the process chambers 2600 may selectively have the same structure. The process chambers 2600 are divided into a plurality of groups. The substrate processing apparatuses of the process chambers 2600 belonging to the same group may selectively have the same structure, and the substrate processing apparatuses of the process chambers 2600 belonging to different groups may selectively have different structures. For example, in a case where the process chambers 2600 are divided into two groups, the process chambers 2600 in the first group are provided to one side of the transportation unit 2400, the process chambers 2600 in the second group are provided to the other side. Among the selectively stacked process chambers 2500, the process chambers 2600, stacked on top of each other, in the first group are positioned over the process chambers 2600, stacked on top of each other, in the second group. A type of processing liquid and the like distinguish the process chamber 2600 in the first group and the process chamber 2600 in the second group from each other.

Figure 3:
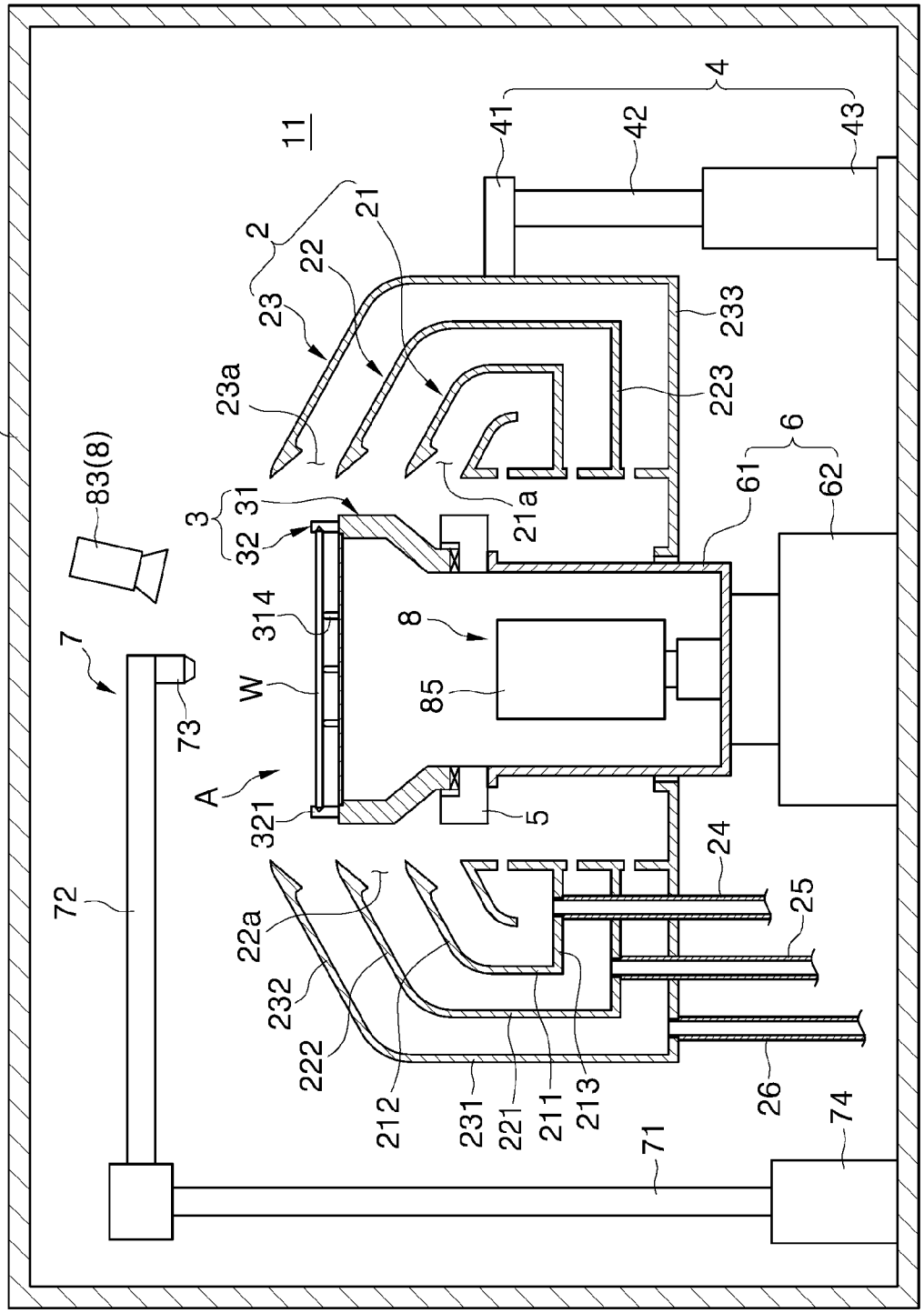
FIG. 3 is a cross-sectional view illustrating the substrate processing apparatus according to the embodiment of the present disclosure.

FIG. 3 is a cross-sectional view illustrating a configuration of the substrate processing apparatus according to the embodiment of the present disclosure. The substrate processing apparatus in FIG. 3 is the liquid processing apparatus that processes the substrate using the processing liquid. At least one or more of the process chambers 2600 (refer to numeral reference 2600 in FIG. 2) includes the liquid processing apparatus as the substrate processing apparatus.

With reference to FIG. 3, the substrate processing apparatus according to the present disclosure includes a chamber 1, a processing receptacle 2, a substrate support unit 3, a first ascending- and descending-enabling drive unit 4 (i.e., a first ascending/descending-enabling drive unit), a rotation drive unit 5, a second ascending- and descending-enabling drive unit 6 (i.e., a second ascending/descending-enabling drive unit), a liquid supply unit 7, and a substrate heating unit 8.

The chamber 1 provides a substrate processing space (internal space) 11 in which a processing process is performed on a substrate W and which is blocked from the outside. Processing is performed on the substrate W (reference character thereof is hereinafter omitted) under normal pressure or under vacuum. A vacuum pump for creating a vacuum atmosphere by depressurizing the substrate processing space 11 is connected to the chamber 1.

The processing receptacle 2, a liquid recovery unit, is positioned in the substrate processing space 11. The processing receptacle 2 is cup-shaped. The processing receptacle 2 has an opening on top and an accommodation space inside. The accommodation space communicates with the opening on top. The substrate support unit 3 is positioned in the accommodation space the processing receptacle 2. The liquid supply unit 7 supplies the processing liquid on an upper surface (front surface) of the substrate supported by the substrate support unit 3, and the processing receptacle 2 collects the processing liquid that is supplied to an upper surface of the substrate by the liquid supply unit 7. The processing receptacle 2 includes a first cup member (first receptacle) 21, a second cup member (second receptacle) 22, and a third cup member (third receptacle) 23. The first cup member 21 surrounds the accommodation space. The second cup member 22 is positioned a distance away from the first cup member 21 in a manner that surrounds the first cup member 21. The third cup member 23 is positioned a distance away from the second cup member 22 in a manner that surrounds the second cup member 22. Accordingly, the innermost first cup member 21 is positioned between the outermost third cup member 23 and the second cup member 22. The processing receptacle 2 is configured from a plurality of the cup members, that is, the first, second, and third cup members 21, 22, and 23. The plurality of the cup members, that is, the first, second, and third cup members 21, 22, and 23 share a central space in common. Each of the first, second, and third cup members 21, 22, and 23 is used to collect different processing liquids. The first cup member 21 has a first intake port 21a that is an opening through which the processing liquid to be collected is introduced. An opening between the first cup member 21 and the second cup member 22 serves as a second intake port 22a through which the processing liquid to be collected is introduced. An opening between the second cup member 22 and the third cup member 23 serves as a third intake port 23a through which the processing liquid to be collected is introduced.

The first cup member 21 includes first wall bodies 211 and 212 and a first bottom 213. the first wall bodies 211 and 212 are positioned to surround the accommodation space. The first wall bodies 211 and 212 each have a first lower wall 211 and a first upper wall 212. The first lower wall 211 has a fixed circular cross section. The first upper wall 212 has the shape of a truncated cone and extends at a fixed inclination angle inward from an upper end of the first lower wall 211. The first lower wall 211 and the first upper wall 212 are integrally combined with each other. The first upper wall 212 has a ring-shaped first protrusion on an upper end. The first protrusion protrudes downward from the upper end of the first upper wall 212. The first bottom 213 is ring-shaped and provides a portion of a shared central space. The first bottom 213 has the first lower wall 211 in the upright position.

The second cup member 22 includes second wall bodies 221 and 222 and a second bottom 223. The second wall bodies 221 and 222 are positioned a distance away from the first wall bodies 211 and 212, respectively, in a manner that surrounds the first wall bodies 211 and 212. The second wall bodies 221 and 222 each have a second lower wall 221 and a second upper wall 222. The second lower wall 221 has a fixed circular cross section. The second upper wall 222 has the shape of a truncated cone and extends at a fixed inclination angle inward from an upper end of the second lower wall 221. The second lower wall 221 and the second upper wall 222 are integrally combined with each other. An upper end of the second upper wall 222 has a greater height than an upper end of the first upper wall 212, and an inner circumference of the second upper wall 222 is the same as or similar to that of the first upper wall 212. With this structure, an opening that serves as the second intake port 22a is provided between the upper end of the first upper wall 212 and the upper end of the second upper wall 222. The second upper wall 222 has a ring-shaped second protrusion on an upper end. The second protrusion protrudes downward from the upper end of the second upper wall 222. The second bottom 223 is positioned a distance in a downward direction away from the first bottom 213. The second bottom 223 is ring-shaped and provides a portion of a shared central space. The second bottom 223 has the second lower wall 221 in the upright position.

The third cup member 23 includes third wall bodies 231 and 232 and a third bottom 233. The third wall bodies 231 and 232 are positioned a distance away from the second wall bodies 221 and 222, respectively, in a manner that surrounds the second wall bodies 221 and 222. The third wall bodies 231 and 232 each have a third lower wall 231 and a third upper wall 232. The third lower wall 231 has a fixed circular cross section. The third upper wall 232 has the shape of a truncated cone and extends at a fixed inclination angle inward from an upper end of the third lower wall 231. The third lower wall 231 and the third upper wall 232 are integrally combined with each other. An upper end of the third upper wall 232 has a greater height than an upper end of the second upper wall 222, and an inner circumference of the second upper wall 222 is the same as or similar to that of the second upper wall 222. With this structure, an opening that serves as the third intake port 23a is provided between the upper end of the second upper wall 222 and the upper end of the third upper wall 232. The third upper wall 232 has a ring-shaped third protrusion on an upper end. The third protrusion protrudes downward from the upper end of the third upper wall 232. The third bottom 233 is positioned a distance in a downward direction away from the second bottom 223. The third bottom 233 is ring-shaped and provides a portion of a shared central space. The third bottom 233 has the third lower wall 231 in the upright position.

The liquid discharge pipes 24, 25, and 26 are connected to liquid discharge ports of the first, second, and third bottoms 213, 223, and 233 of the first, second, and third cup members 21, 22, and 23, respectively. The liquid discharge pipes 24, 25, and 26 extend downward and discharge the processing liquid that is collected into the first, second, and third cup members 21, 22, and 23 through the first, second, and third intake ports 21a, 22a, and 23a, respectively. The processing liquid that is discharged through the liquid discharge pipes 24, 25, and 26 is recycled by a liquid recycle unit and then is reused.

The substrate support unit 3 supports the substrate when performing the substrate processing process. The substrate support unit 3 is rotated by the rotation drive unit 5 while the substrate processing process is performed. The substrate support unit 3 includes a spin head 31 and substrate chuck 32.

In a case where the substrate is a wafer, the spin head 31 has a circular upper surface corresponding to the wafer. The substrate is provided over the spin head 31. The spin head 31 is positioned in the accommodation space in the processing receptacle 2. The spin head 31 is rotated by the rotation drive unit 5 with respect to the axis in the third direction (refer to reference character D-3 in FIG. 2). The rotation drive unit 5 rotates the spin head 31 at a high speed. A plurality of support pins 314 is provided on the spin head 31. The support pins 314, positioned a distance away from each other, protrude from an upper surface of the upper head 31 in a manner that supports a lower surface (rear surface) of the substrate.

The substrate chuck 32 is provided on the spin head 31. The substrate chuck 32 includes a plurality of chuck pins 321 provided on the top of the spin head 31. The chuck pins 321 are positioned a distance farther away from the center of the spin head 31 than the support pins 314. The substrate chuck 32 is configured in such a manner that the chuck pins 321 each support a lateral surface of the substrate and thus prevent the substrate from deviating from a home position thereof. The chuck pins 321 are moved by a pin driver toward the center of the spin head 31 or outward from the center thereof, and then are positioned at a waiting position or a support position. The waiting position is positioned a distance farther away from the center of the spin head 31 than the support position at which the substrate is supported by the chuck pins 321. The chuck pins 321 are moved to the waiting position and wait there when the substrate is loaded over the spin head 31 or when the substrate is unloaded from over the spin head 31. The chuck pins 321 are moved to the support position to support the substrate while the processing process is performed on the loaded substrate. At the support position, the chuck pins 321 are brought into contact with and support the lateral surface of the substrate.

The first ascending- and descending-enabling drive unit 4 enables the processing receptacle 2 to ascend and descend in the third direction D-3 (refer to reference character D-3 in FIG. 2). The first ascending- and descending-enabling drive unit 4 is configured in such a manner to move the first, second, and third cup members 21, 22, and 23 together or individually. When the processing receptacle 2 ascends and descends by the first ascending- and descending-enabling drive unit 4, relative heights of the first, second, and third cup members 21, 22, and 23 with respect to the substrate supported by the substrate support unit 3 are changed. The first ascending- and descending-enabling drive unit 4 includes a bracket 41, a rod 42 that is enabled to ascend and descend, and a rod driver 43.

The bracket 41 is mounted outside of the processing receptacle 2. Specifically, the bracket 41 is mounted on an outer wall of the third wall bodies 231 and 232 that constitute the third cup member 23. The rod 42 is combined with the bracket 41. The rod 42 extends in the third direction D-3 (refer to reference character D-3 in FIG. 2). The rod driver 43 is configured in such a manner that the rod 42 is enabled to ascend and descend by motive power from a power source.

When the substrate is loaded over the spin head 31 or unloaded from over the spin head 31, the first ascending- and descending-enabling drive unit 4 enables the processing receptacle 2 to descend in such a manner as to prevent interference between the transportation robot 2440 (refer to character number 2440 in FIG. 2) and the processing receptacle 2. In addition, while performing the substrate processing process, the first ascending- and descending-enabling drive unit 4 enables the processing receptacle 2 to ascend and descend and adjusts a height of the processing receptacle 2 in such a manner that the processing liquid is introduced into one of the first, second, and third intake ports 21a, 22a, and 23a, which are determined in advance according to a type of processing liquid supplied to the upper surface of the substrate by the liquid supply unit 7.

The rotation drive unit 5 rotates the substrate support unit 3 and thus rotates the substrate supported by the substrate support unit 3 about the axis in the third direction D-3 (refer to reference character D-3 in FIG. 2). With the rotation drive unit 5, the substrate is rotated while performing the substrate processing process, the processing liquid supplied on the upper surface of the substrate that is being rotated is spread, and the spread processing liquid is introduced into one, determined in advance, of the first, second, and third intake ports 21a, 22a, and 23a.

The second ascending- and descending-enabling drive unit 6 enables the substrate support unit 3 to ascend and descend in the third direction D-3 (refer to reference character D-3 in FIG. 2) and thus enables the substrate supported by the substrate support unit 3 to ascend and descend in the same direction as the substrate support unit 3. When the second ascending- and descending-enabling drive unit enables the substrate support unit 3 to ascend and descend, a relative height of the substrate supported by the substrate support unit 3 with respect to the processing receptacle 2 is changed. In addition, a height of the processing liquid from the liquid supply unit 7 with respect to the substrate is changed. The first ascending- and descending-enabling drive unit 4 that enables the processing receptacle 2 to ascend and descend may be omitted considering the fact that a relative height of the substrate with respect to the processing receptacle 2 is changed. Of course, instead of the first ascending- and descending-enabling drive unit 4, the second ascending- and descending-enabling drive unit 6 may be omitted.

The liquid supply unit 7 supplies the processing liquid to the upper surface of the substrate supported by the substrate support unit 3. The liquid supply unit 7 includes an arm support 71, a nozzle arm 72, a nozzle 73, and a support driver 74.

In the substrate processing space 11, the arm support 71 is positioned outside of the processing receptacle 2 and extends in the third direction D-3 (refer to reference character D-3 in FIG. 2). The nozzle arm 72 is combined an upper end portion of the arm support 71 and extends in a direction perpendicular to the third direction D-3. The nozzle 73 is mounted on a tip portion of the nozzle arm 72 in a manner that discharges the processing liquid downward. The support driver 74 is configured in such a manner as to performs at least one or both of an operation of rotating the arm support 71 (rotating about the axis in the third direction D-3) an operating of enabling the arm support 71 to ascend and descent (to ascend and descend in the third direction D-3). When the support driver 74 operates, the nozzle 73 is moved (rotates and/or ascends and descends).

With the liquid supply unit 7, the nozzle 73 is rotated by the support driver 74 about the arm support 71 and is positioned at the waiting position or the supply position. At this point, at the waiting position, the nozzle 73 deviates from over the processing receptacle 2, and at the supply position, the nozzle is positioned over the processing receptacle 2 in such a manner that the processing liquid discharged from the nozzle 73 is supplied to the upper surface of the substrate. When the substrate is loaded over the spin head 31 or unloaded from over the spin head 31, the nozzle 73 is moved to the waiting position and waits there. While the processing process is performed on the loaded substrate, the nozzle 73 is moved the supply position and supplies the processing liquid to the upper surface of the substrate.

A plurality of the liquid supply units 7 are provided. Alternatively, a plurality of the nozzles 73 are provided. In a case where the plurality of the liquid supply units 7 are provided or the liquid supply unit 7 includes the plurality of the nozzles 73, each of the plurality of the liquid supply units 7 or each of the plurality of the nozzles 73 are for supplying different processing liquid to the upper surface of the substrate. In this case, the processing liquid is first processing liquid and second processing liquid. High-temperature (for example, 150 to 170° C.) processing liquid is used as the first processing liquid. Specifically, the first processing liquid is phosphoric acid, sulfuric acid, or a mixture of phosphoric acid and sulfuric acid. Room-temperature deionized water (DIW) is used as the second processing liquid.

Figure 4:
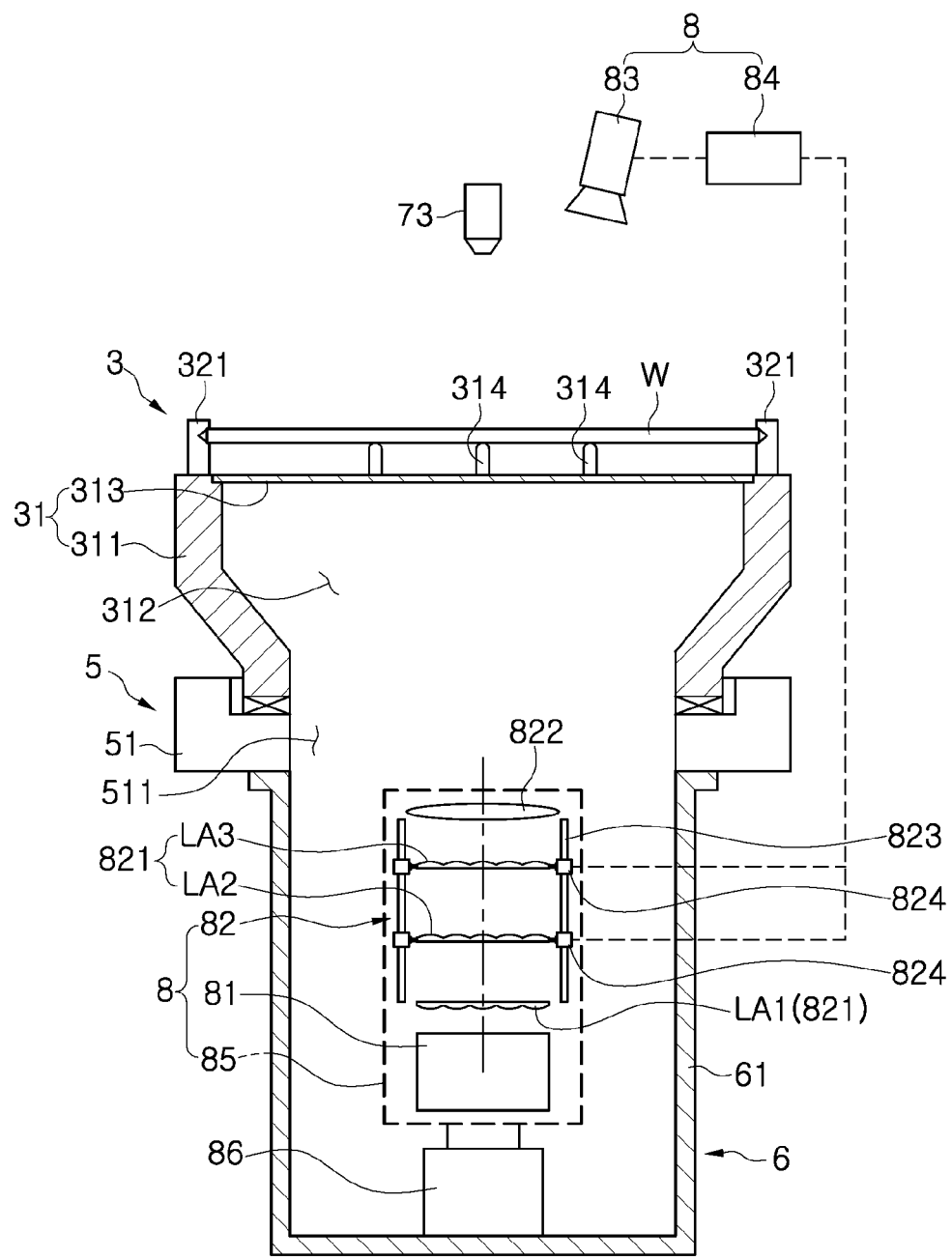
FIG. 4 is an enlarged view illustrating an A portion in FIG. 3, more particularly, a view illustrating an example of a substrate heating unit that constitutes the substrate processing apparatus according to the embodiment of the present disclosure.
Figure 5:
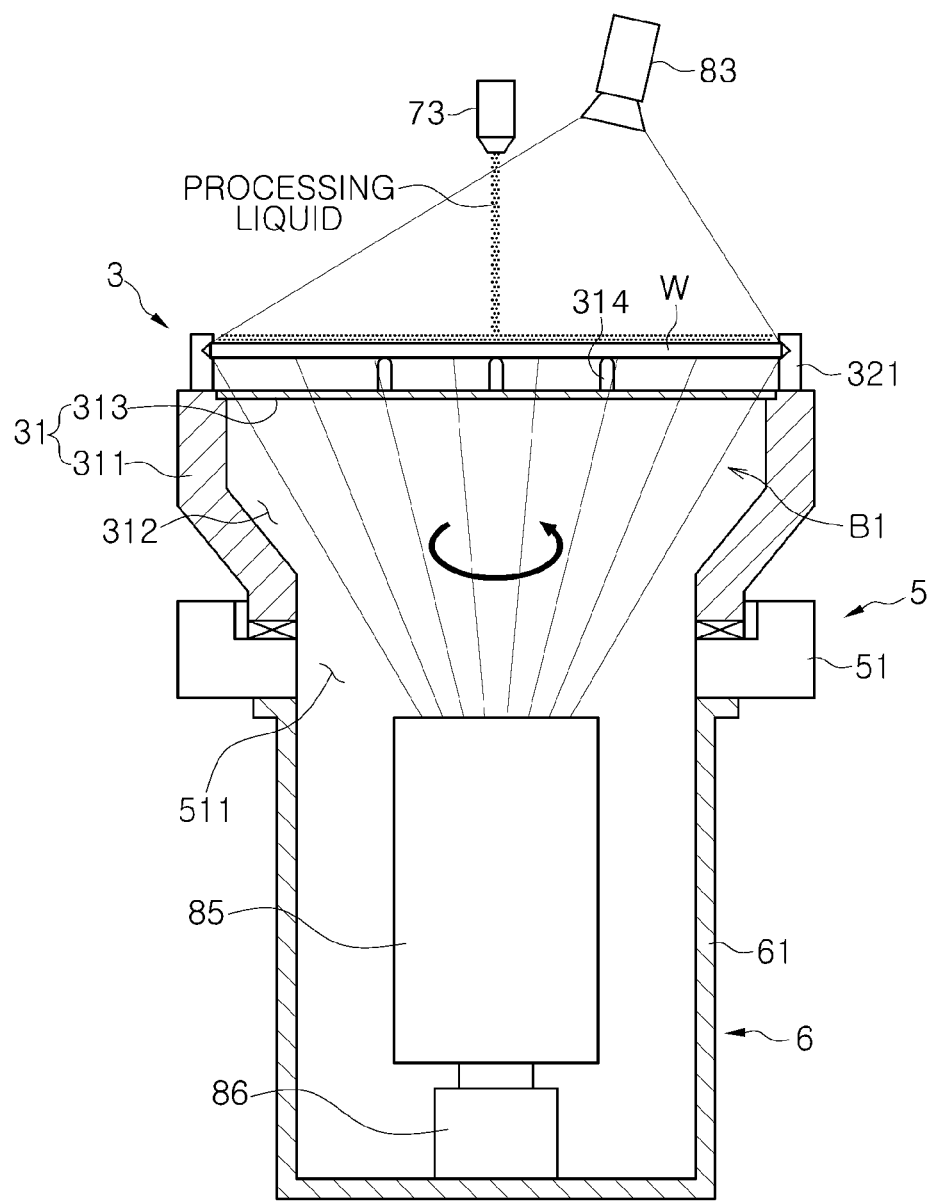
FIGS. 5 and 6 are views each illustrating operation of the substrate heating unit in FIG. 4.
Figure 6:
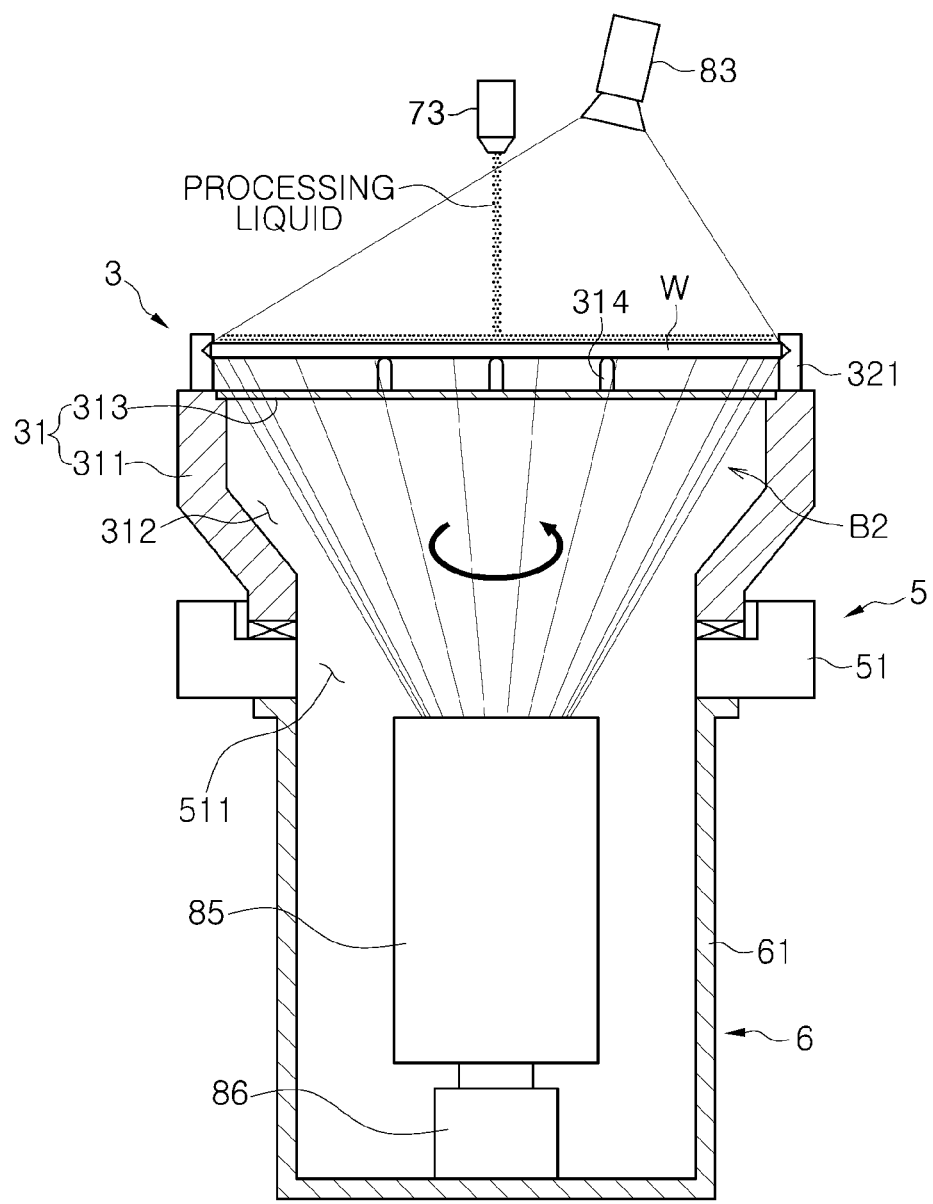

When performing the substrate processing process, the substrate heating unit 8 heats the substrate supported by the substrate support unit 3. As illustrated in FIGS. 4 to 6, the substrate heating unit 8 includes a laser generator 81, a beam shaper 82, a temperature detector 83, and a controller 84. The substrate heating unit 8 is configured in such a manner to heat the substrate using a laser. The laser generator 81 provides a laser beam for heating the substrate. The beam shaper 82 processes the laser beam provided by the laser generator 81 and selectively provides one of a first beam B1 and a second beam B2 that have different energy distributions to the substrate. The laser beam (one beam selected from between the first beam and the second beam) reaching the substrate heats the substrate. The temperature detector 83 measures a distribution of temperature of the substrate in real time. The controller 84 controls the beam shaper 82 in such a manner that the beam shaper 82 processes the laser beam into one beam selected from between the first beam B1 and the second beam B2 according to the distribution of temperature of the substrate, which is measured by the temperature detector 83. The substrate heating unit 8 may further include a casing 85 (i.e., a housing). The casing 85 protects the laser generator 81 and the beam shaper 82 from the outside. The casing 85 is configured in such a manner as to have a structure in which interference does not occur to the laser beam traveling from the laser generator 81 to the substrate.

The substrate heating unit 8 emits the laser beam to the lower surface of the substrate to heat the substrate. To emit the laser beam in this manner, the substrate support unit 3 has an exposure opening 312. The lower surface of the substrate is exposed through the exposure opening 312. The beam shaper 82, positioned under the substrate support unit 3, provides one beam selected from between the first beam B1 and the second beam B2 to the lower surface of the substrate through the exposure opening 312. The rotation drive unit 5 is configured to have a beam passage 511 communicating with the exposure opening 312 under the substrate support unit 3. The second ascending- and descending-enabling drive unit 6 is configured in such a manner as to have a housing 61 communicating with the beam passage 511 under the rotation drive unit 5. With these configurations, the substrate support unit 3, the rotation drive unit 5, and the second ascending- and descending-enabling drive unit 6 are positioned along the third direction D-3 (refer to reference character F-3 in FIG. 2), and the beam shaper 82, along with the laser generator 81, is accommodated within the housing 61. First, details of this will be provided below.

The exposure opening 312 in the substrate support unit 3 is positioned with the spin head 31. The spin head 31 has a head body 311 and a support plate 313. The head body 311 has the exposure opening 312 inside. The exposure opening 312 extends in an upward-downward direction, that is, in the third direction D-3 (refer to reference character D-3 in FIG. 2). The support plate 313 covers an upper end of the exposure opening 312.

The exposure opening 312 has a size such that the entire lower surface of the substrate is exposed. The chuck pins 321 on the top of the head body 311 is positioned in the vicinity of the exposure opening 312 and thus supports the lateral surface of the substrate. The exposure opening 312 is taped from an upper end thereof to a lower end there. The head body 311 is also tapered from an upper end thereof to a lower end thereof.

The support plate 313 is combined with the head body 311 in a manner that covers the exposure opening 312 from above. The support plate 313 has the support pins 314. Each of the support pins 314 protrudes from an upper surface of the support plate 313 and has a fixed length.

The support plate 313 including the support pins 314 is made of a material transmitting the laser beam (that is, one beam selected from between the first beam and the second beam) that results from the processing by the beam shaper 82. The laser beam that results from the processing passes through the support plate 313 and is emitted to the lower surface of the substrate. The support plate 313 is made of a material having a high laser transmittance and an excellent corrosion resistance to the processing liquid. For example, the support plate 313 is made of ceramics, such as sapphire or quartz.

The rotation drive unit 5 includes a head support member 51 and a head driver. The head support member 51 supports the spin head 31 in such a manner that the spin head 31 is rotatable about the axis in the third direction D-3 (refer to reference character D-3 in FIG. 2). The head driver is configured in such a manner that the spin head 31 is rotated by a motive power from the power source.

The head support member 51 is coherently combined with a lower portion of the head body 311 and has the beam passage 511 communicating with the exposure opening 312. The head support member 51 has the beam passage 511 inside. The beam passage 511 extends in the upward-downward direction. The head support member 51 is ring-shaped. The head driver is a power train that transfers a rotational force of a motor to the spin head 31. The head driver includes a rack and pinion. A rack engaged with a pinion is positioned along an external circumference of the head body 311 on a lower portion of the head body 311. The pinion is mounted on the head support member 51.

The second ascending- and descending-enabling drive unit 6 includes the housing 61 and a housing driver 62 (refer to reference character 62 in FIG. 3). The housing 61 is combined with the rotation drive unit 5. The housing driver 62 is configured in such a manner that the rotation drive unit 5 ascends and descends by a motive power from the power source. When the rotation drive unit 5 ascends and descends, the spin head 31 ascends and descends together. The head support member 51 is supported on the housing 61 that has an opening on top. The opening communicates with the beam passage 511. The housing 61 is positioned in such a manner as to pass through a shared central space in the processing receptacle 2. The housing driver 62 is combined with a lower portion of the housing 61. In the substrate processing space 11, the housing driver 62 is positioned outside of the processing receptacle 2.

With reference back to the substrate heating unit 8, the laser generator 81 has at least one or more laser light sources and is configured in such a manner as to provide a laser beam with a required wavelength to the beam shaper 82. The laser light source may be a single bulk laser or may be a fiber laser bundle that is configured from a plurality of fiber lasers in parallel with each other. When the bulk laser is used as the laser light source, the laser generator 81 may further include a beam enlargement unit that enlarges the laser beam output from the laser light source to the required wavelength. The laser generator 81 provides the laser beam with a waveform excellently absorbable by the substrate, as the laser beam for heating the substrate. For example, the substrate is a wafer, and a wavelength of the laser beam, output from the laser generator 81, is 355 nm. When the laser beam with a wavelength highly absorbable by the substrate is provided, the substrate is rapidly heated to a required temperature.

The laser beam provided by the laser generator 81 has a Gaussian distribution. Energy is the highest at the center of the laser beam. As the edge thereof is approached, the energy is lower. The beam shaper 82 processes the laser beam having the Gaussian distribution for conversion into a homogenized flat top laser beam. With reference to FIG. 5, the first beam B1 obtained by the beam shaper 82 is an overall uniform flat top laser beam having an overall uniform energy distribution. For example, the energy distribution of the overall uniform flat top laser beam is spatially uniform, and thus when the laser beam irradiates on a wafer, the wafer may be heated uniformly. With reference to FIG. 6, the second beam B2 obtained by the beam shaper 82 is an edge-enhanced flat top laser beam having an energy distribution in which an edge of the second beam B2 is relatively enhanced compared to the central of the second beam B2. For example, the energy distribution of the edge-enhanced flat top laser beam may be spatially uniform except for the edge of the laser beam. For example, a first portion of the laser beam may have a higher energy intensity compared to a second portion of the laser beam. The first portion of the laser beam may be directed toward an edge portion of the substrate, and the second portion of the laser beam may be directed toward the central portion of the substrate. When the laser beam irradiates on a wafer, more energy may be transferred to an edge region of the wafer compared to the central region of the substrate.

The beam shaper 82 processes the laser beam from the laser generator 81 in such a manner that an image of the laser beam that is emitted to the substrate and then reaches the lower surface of the substrate is substantially the same in size and shape as, or similar in size and shape to, the substrate. Accordingly, the first beam B1 may be emitted to the lower surface of the substrate and thus may heat the substrate to an overall uniform temperature. Furthermore, the second beam B2 may be emitted to the lower surface of the substrate and thus may heat an edge of the substrate to a higher temperature than the center of the substrate.

Figure 7:
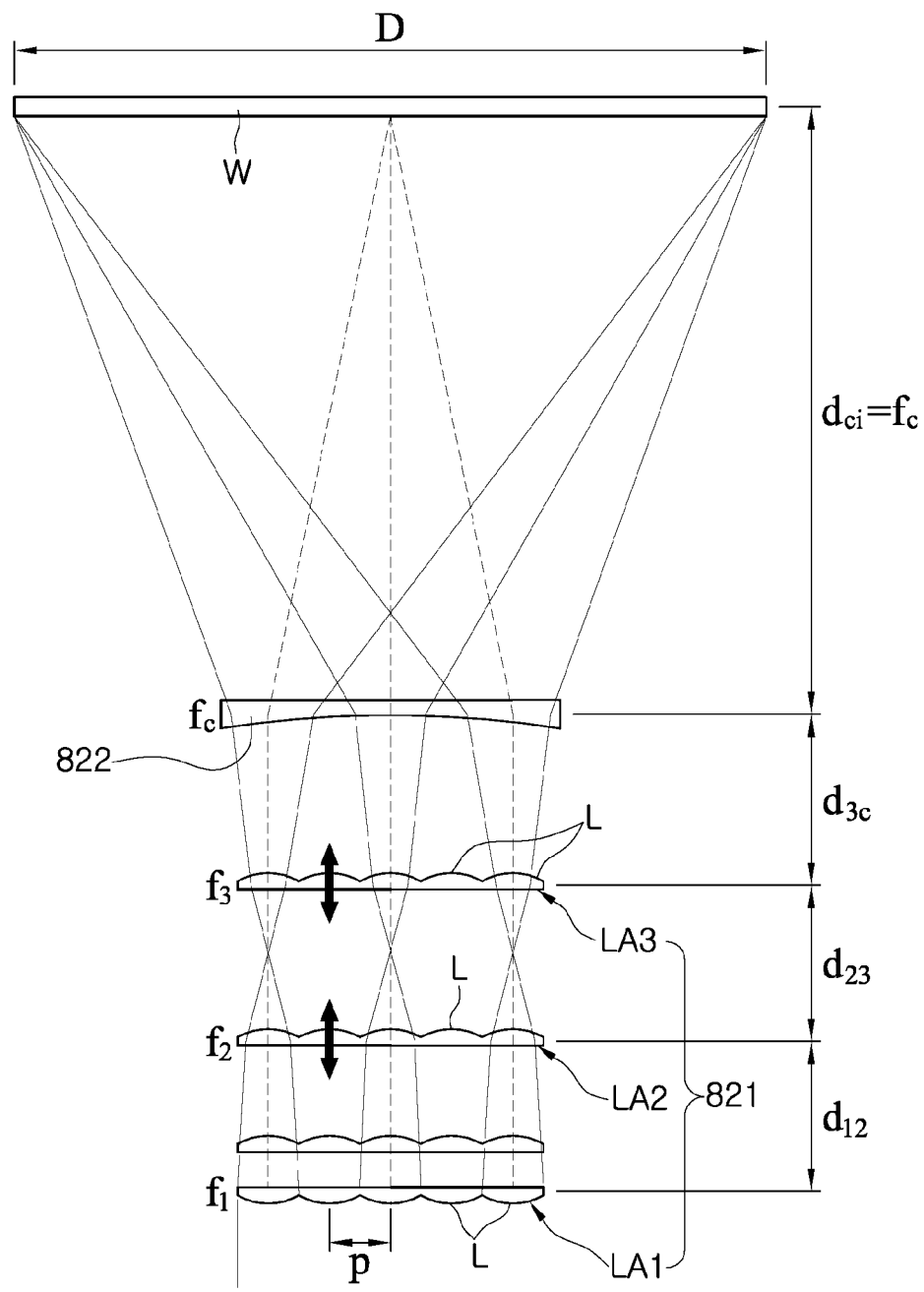
FIG. 7 is a beam shaper of the substrate heating unit in FIG. 4.

FIG. 7 illustrates the beam shaper 82 of the substrate heating unit 8 in FIG. 4. With reference to FIGS. 4 and 7, the beam shaper 82 includes a lens assembly 821 and a condensing lens 822. The lens assembly 821 divides the laser beam received from the laser generator 81 into a plurality of beams. The condensing lens 822 condenses the beams resulting from the division by the lens assembly 821 on the substrate W. In an example embodiment, the condensing lens 822 renders the beams received from the lens assembly 821 into a convergent beam to illuminate the substrate W. With the lens assembly 821 and the condensing lens 822, the laser beam having the Gaussian energy distribution, which is provided by the laser generator 81, is converted into a uniform energy distribution. The laser beam with a uniform energy distribution may be referred to as a flat-top laser beam. The lens assembly 821 includes three lens arrays, that is, lens arrays LA1, LA2, and LA3 that are positioned along a beam traveling path that is a path along which the laser beam from the laser generator 81 travels. The laser beam provided by the laser generator 81 travels in the third direction D-3 (refer to reference character D-3 in FIG. 2) toward the substrate along at least one section of the beam traveling path. The three lens arrays, the lens arrays LA1, LA2, and LA3, are positioned in a row in the third direction D-3. The three lens arrays, the lens arrays LA1, LA2, and LA3, are positioned in a manner that has a common axis (i.e., a common optical axis). The condensing lens 822 is positioned in a manner that has an optical axis in common with the three lens array, the lens arrays LA1, LA2, and LA3. In an exemplary embodiment, the condensing lens 822, and the three lens arrays LA1, LA2, and LA3 may be arranged such that an optical axis of the condensing lens 822 is aligned with an optical axis of each of three lens arrays LA1, LA2, LA3. The three lens arrays LA1, LA2, and L3 may have a common optical axis.

Each of the three lens arrays, the lens arrays LA1, LA2, and LA3, has a lens base and lenslets L. The lenslets L are positioned a distance away from each other on the lens base in a manner that forms a plurality of columns and a plurality of rows. In the three lens arrays, the lens arrays LA1, LA2, and LA3, the lenslets L in adjacent columns or the lenses in adjacent rows may be positioned at the same position or may be positioned at different positions. In each of the three lens arrays, the lens arrays LA1, LA2, and LA3, concave lenses, convex lenses, or concave and converts lenses are used as the lenslets L. Concave lenses or convex lenses as the lenslets L may be micro-lenses. The three lens arrays, the lens arrays LA1, LA2, and LA3, may be the same.

A shape of the image of the laser beam reaching the lower surface of the substrate is determined according to shapes of the lenslets L. When the lenslets L have the shape of a square, the image of the laser beam has the shape of a square. In an exemplary embodiment, the image of the laser beam generated from the lenslets L which are arranged to fill a lens array having a square shape, may correspond to the shape of a square. When the lenslets L have the shape of a circle, the image of the laser beam has the shape of a circle. In an exemplary embodiment, the image of the laser beam generated from the lenslets L which are arranged to fill a lens array having a circular shape, may correspond to the shape of a circle. The lenslets L have a shape corresponding to a shape of the substrate. For example, when the substrate is a wafer, the lenslets L have a shape of a circle corresponding to a shape of the wafer. In this case, the lens base may take the shape of a circle corresponding to the shape of the wafer.

The three lens arrays, the lens arrays LA1, LA2, and LA3 are defined as a first lens array LA1, a second lens array LA2, and a third lens array LA3, respectively. The second lens array LA2 is positioned between the first lens array LA1 and the third lens array LA3. The third lens array LA3 is positioned between the second lens array LA2 and the condensing lens 822. The laser beam from the laser generator 81 passes through the first lens array LA1, the second lens array LA2, the third lens array LA3, and the condensing lens 822 in this order. Whereas positions of the first lens array LA1 and the condensing lens 822 are fixed, the second lens array LA2 and the third lens array LA3 are provided in a manner that is movable along a section, in parallel with the third direction D-3 (refer to reference character D-3 in FIG. 2), of the beam traveling path.

The second lens array LA2 and the third lens array LA3 are moved in a straight line along a guide 823 extending in the third direction D-3 (refer to reference character D-3 in FIG. 2). The beam shaper 82 may further include a lens drive mechanism 824 that individually moves the second lens array LA2 and the third lens array LA3 that are movable. The lens drive mechanism 824 is configured in such a manner that the second lens array LA2 and the third lens array LA3 are moved by a motive power from the power source.

In FIG. 7, $f_1$ is a focal length of the first lens array LA1, $f_2$ is a focal length of the second lens array LA2, $f_3$ is a focal length of the third lens array LA3, and $f_c$ is a focal length of the condensing lens 822. $d_{12}$ is a distance between the first lens array LA1 and the second lens array LA2. $d_{23}$ is a distance between the second lens array LA2 and the third lens array LA3. $d_{3c}$ is a distance between the third lens array LA3 and the condensing lens 822. $d_{ci}$ is a distance between the condensing lens 822 and the substrate. p is a pitch between the lenslets L. When performing a zoom operation in which the lens drive mechanism 824 moves the second lens array LA2 and the third lens array LA3, the distance $d_{12}$ between the first lens array LA1 and the second lens array LA2, the distance $d_{23}$ between the second lens array LA2 and the third lens array LA3, and the distance $d_{3c}$ between the third lens array LA3 and the condensing lens 822 are changed. Accordingly, the inclination, the homogeneity, and the like of the flat top laser beam, along with a size of the image of the flat top laser beam reaching the lower surface of the substrate, are changed.

In this case, the size D of the image of the laser beam is calculated using the following Equation 1. In an exemplary embodiment, the image of the laser beam may be of a circular shape with the size D (i.e., a diameter) which is substantially the same as a diameter of the wafer W. The term "same" as used herein when referring to sizes does not necessarily mean an exactly identical size, but are intended to encompass nearly identical sizes within acceptable variations that may occur, for example, due to manufacturing processes. The term "substantially" may be used herein to emphasize this meaning, unless the context or other statements indicate otherwise. For example, items described as "substantially the same" may be exactly the same, or may be the same within acceptable variations that may occur, for example, due to manufacturing processes. The present invention is not limited thereto. The size D of the image of the laser beam may be controlled to be greater than the diameter of the wafer by a predetermined size.

For reference, the lenslets L are circular. When the lenslets L are positioned in a manner that is connected to each other, the pitch p is a diameter of the lenslets L.

$$D = \frac{pf_c}{f_1 f_2 f_3}[(f_1 + f_2 - d_{12})(d_{23} - f_3) + f_1 f_2 + d_{12} f_2] \quad \text{[Equation 1]}$$

To process the image of the laser beam in such a manner that the image thereof has optimal inclination and homogeneity, an imaging condition has to be satisfied. The imaging condition is expressed as in the following Equations 2 and 3.

$$d_{12} = \frac{f_2(f_3 - d_{23})}{f_2 + f_3 - d_{23}} \quad \text{[Equation 2]}$$

$$d_{23} = \frac{f_2 f_3 - d_{12}(f_2 + f_3)}{f_2 - d_{12}} \quad \text{[Equation 3]}$$

When the second lens array LA2 and the third lens array LA3 are moved and then are positioned at positions that satisfy Equation 2 or 3 or satisfy both Equations 2 and 3, the flat top laser beam having the optimal inclination and homogeneity is provided. The flat top laser beam having the optimal inclination and homogeneity is a first beam B1 that is an overall uniform flat top laser beam having an overall uniform energy distribution. In contrast, when the second lens array LA2 and the third lens array LA3 are moved and then are positioned at positions that does not satisfy both Equations 2 and 3, the flat top laser beam having relatively low inclination and homogeneity is provided. The flat top laser beam having the relatively low inclination and homogeneity is a second beam B2 that is the edge-enhanced flat top laser beam having the energy distribution in which the edge of the beam is relatively enhanced.

When the imaging condition is satisfied, a size D of the image of the laser beam is calculated using Equation 4.

$$D = \frac{pf_c f_2}{f_3(f_2 - d_{12})} = \frac{pf_c(f_2 + f_3 - d_{23})}{f_2 f_3} \quad \text{[Equation 4]}$$

For example, when it is assumed that p is 4.0 mm, $f_1$, $f_2$, and $f_3$ are all 38.24 mm, fc is 75.0 mm, and $d_{12}$, $d_{23}$, and $d_{ci}$ are 1.20 mm, 37.0 mm, and 11.8 mm, respectively, the size D of the image of the laser beam that satisfies the imaging condition is 8.1 mm. In addition, when it is assumed that p is 4.0 mm, $f_1$, $f_2$, and $f_3$ are all 38.24 mm, $f_c$ is 75.0 mm, and $d_{12}$, $d_{23}$, and $d_{ci}$ are 12.8 mm, 19.0 mm, and 18.2 mm, respectively, the size D of the image of the laser beam that satisfies the imaging condition is 11.8 mm. In addition, when it is assumed that p is 4.0 mm, $f_1$, $f_2$, and $f_3$ are all 38.24 mm, $f_c$ is 75.0 mm, and $d_{12}$, $d_{23}$, and $d_{ci}$ are 18.9 mm, 1.0 mm, and 30.1 mm, respectively, the size D of the image of the laser beam that satisfies the imaging condition is 15.5 mm. These data are summarized in the following table.

| p | $f_1 = f_2 = f_3$ | $f_c$ | $d_{12}$ | $d_{23}$ | $d_{ci}$ | D |
|---|---|---|---|---|---|---|
| 4.0 mm | 38.24 mm | 75.0 mm | 1.20 mm | 37.0 mm | 11.8 mm | 8.1 mm |
| | | | 12.8 mm | 9.0 mm | 18.2 mm | 11.8 mm |
| | | | 18.9 mm | 1.0 mm | 30.1 mm | 15.5 mm |

Figure 8A:
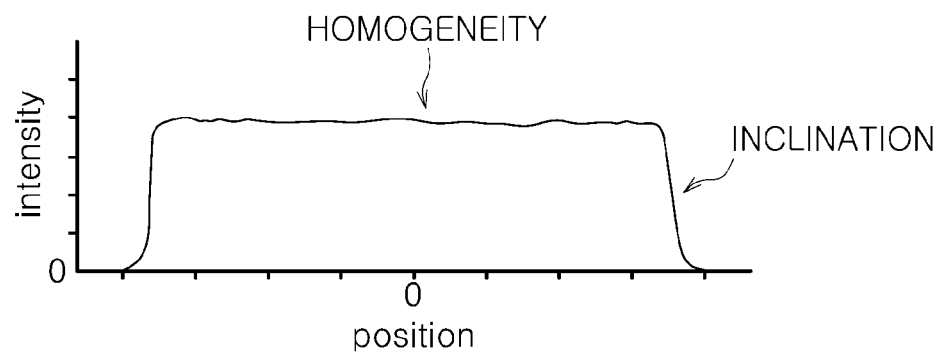
FIGS. 8A and 8B are graphs each illustrating an energy distribution for a laser beam from the substrate heating unit in FIG. 4.
Figure 8B:
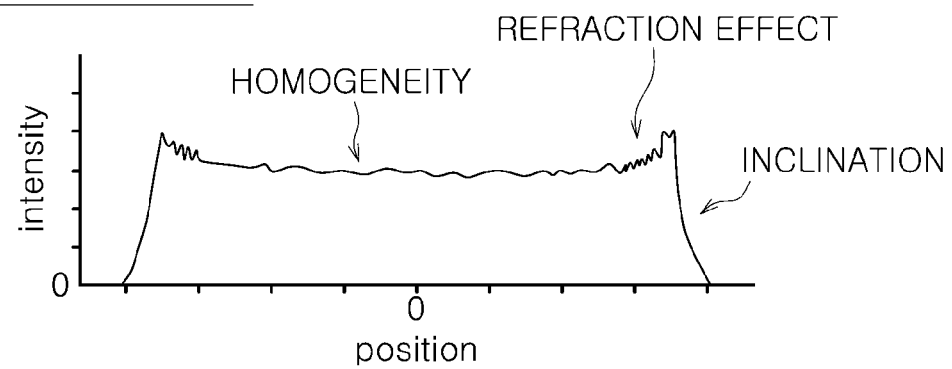

FIGS. 8A and 8B are graphs each illustrating an energy distribution for the laser beam that results from the processing by the beam shaper 82. FIG. 8A illustrates the energy distribution for the first beam B1 and FIG. BA illustrates the energy distribution for the second beam B2.

From FIG. 8A, it can be seen that, when the second lens array LA2 and the third lens array LA3 are positioned in a manner that satisfies at least one or two of Equations 2 and 3, the flat top laser beam has the optimal inclination and homogeneity and thus the overall uniform flat top laser beam is provided. From FIG. 8B, it can be seen that, when the second lens array LA2 and the third lens array LA3 are positioned in a manner that does not satisfy both Equations 2 and 3, the inclination and homogeneity of the flat top laser beam are relatively decreased, and thus the edge-enhanced flat top laser beam is provided. Sections of graphs in FIGS. 8A and 8B, which correspond to edges of the flat top laser beams, respectively, are compared with each other. From FIG. 8A, it can be seen that the first beam B1 experiences a relatively small change due to a diffraction effect and thus has a small deviation of the energy distribution. From FIG. 8B, it can be seen that energy strength of an edge of the second beam B2 is greatly increased due to the refraction effect and thus the edge thereof is enhanced. In addition, from FIGS. 8A and 8B, it can be seen that each of the first beam B1 and the second beam B2 in FIGS. 8A and 9B, has different inclination, the first beam B1 has inclination that is almost vertical, and the second beam B2 has gentler inclination than the first beam B1.

The temperature detector 83 includes a thermal imaging camera that is positioned above the substrate support unit 3. When a distribution of temperature of the substrate, measured by the temperature detector 83 is generally uniform, the controller 84 operates the lens drive mechanism 824 in such a manner that the overall uniform first beam B1 is emitted to the substrate and the entire substrate is heated to a uniform temperature. In contrast, when temperature of the edge of the substrate is relatively low and it is detected by the temperature detector 83 that the distribution of temperature of the substrate is non-uniform, the controller 84 operates the lens drive mechanism 824 in such a manner that the edge-enhanced second beam B2 is emitted to the substrate and the edge of the substrate is heated to a higher temperature than the center thereof. With the second beam B2, a temperature difference between the edge of the substrate and the center thereof is minimized. The temperature difference between the edge of the substrate and the center thereof is due to a temperature drop phenomenon that occurs when the high temperature processing liquid supplied to the center of the substrate is spread toward the edge thereof.

As described above, the substrate heating unit 8 processes the laser beam having the Gaussian distribution, which is provided by the laser generator 81, into the homogenized flat top laser beam, provides the resulting beam to the substrate, and thus heats the substrate. At this point, the size of the image of eh flat top laser beam and characteristics of the flat top laser beam are determined according to positions of the second lens array LA2 and the third lens array LA3. Therefore, the first beam B1 (the overall uniform beam) as the flat top laser beam may be provided, with the second lens array LA2 and the third lens array LA3 being positioned at the positions that satisfy the imaging condition. Furthermore, the second beam B2 (the edge-enhanced beam) as the flat top laser beam may be provided, with the second lens array LA2 and the third lens array LA3 being positioned at the positions that do not satisfy the imaging condition. For example, the substrate heating unit 8 may be set in such a manner that the image of the first beam B1 correspondingly has the same size than the substrate and the image of the second beam B2 has a somewhat smaller size or a somewhat larger size than the substrate. The substrate heating unit 8 may operate according to this setting. Conversely, the substrate heating unit 8 may be set in such a manner that the image of the second beam B2 correspondingly has the same size than the substrate and the image of the first beam B1 has a somewhat smaller size or a somewhat larger size than the substrate. The substrate heating unit 8 may operate according to this setting.

Reference character 86 refers to a distance adjustment unit that adjusts a distance between the substrate and the beam shaper 82. The distance adjustment unit 86 is mounted on an inner bottom of the housing 61 and is combined with the casing 85. The distance adjustment unit 86 is configured in such a manner as to move the casing 85 along the third direction D-3 (refer to reference character D-3 in FIG. 2) using a motive power from the power source. When the housing 61 is moved along the third direction D-3, the distance between the substrate and the beam shaper 82 is decreased. Conversely, when the housing 61 is moved in a direction opposite to the substrate along the third direction D-3, the distance between the substrate and the beam shaper 82 is increased.

Figure 9:
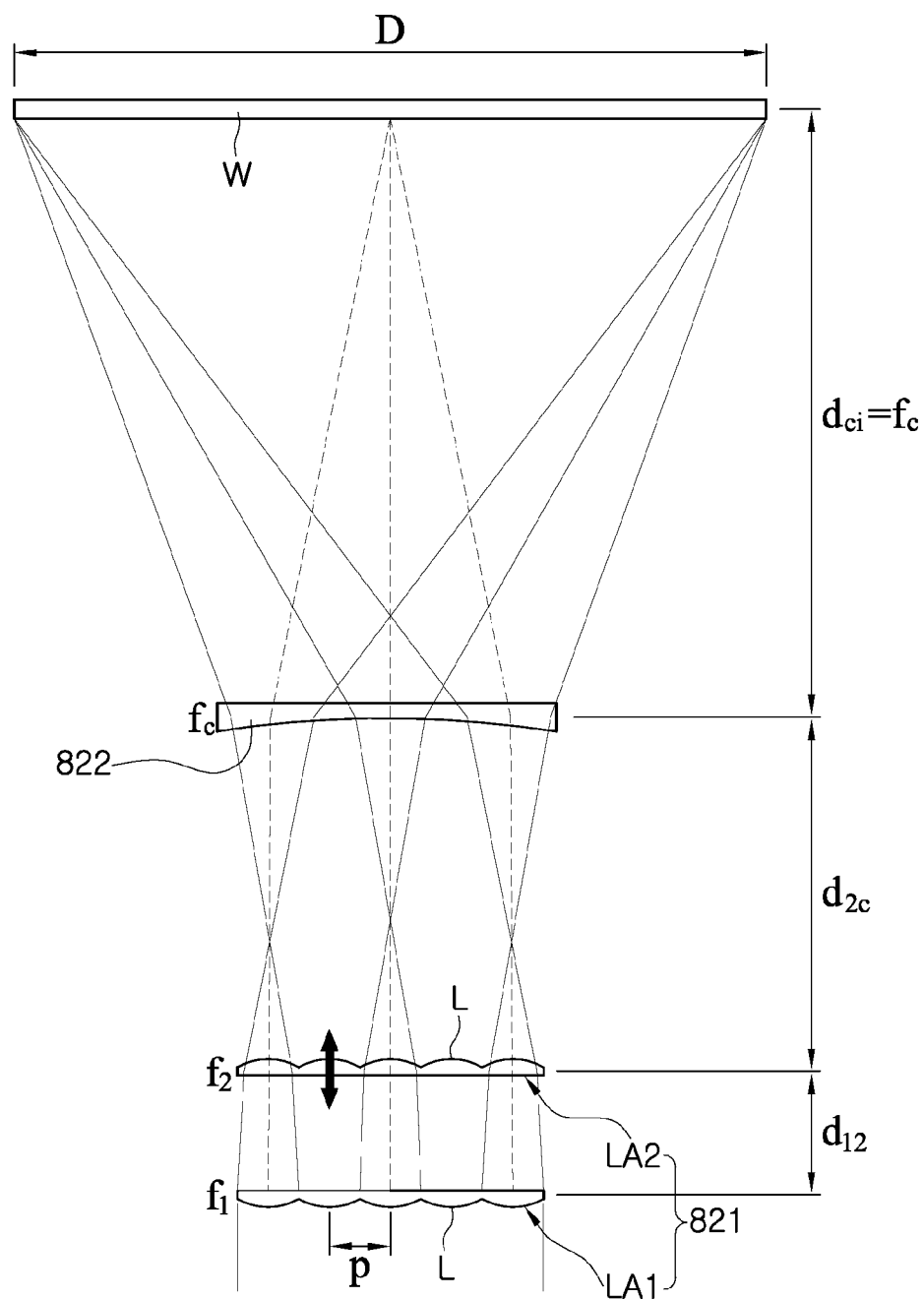
FIG. 9 is a view illustrating an example of the substrate heating unit that constitutes the substrate processing apparatus according to the embodiment of the present disclosure.

FIG. 9 illustrates another example of the substrate heating unit that finds application in the substrate heating apparatus according to the embodiment of the present disclosure. A difference of the example of the substrate heating unit in FIG. 9 from the above-described example of the substrate heating unit is that the lens assembly 821 includes two lenses arrays, the lens arrays LA1 and LA2. Except for this difference, the two examples are all the same in terms of other configurations and operations. For reference, FIG. 9 illustrates the example of the substrate heating unit with a focus on the beam shaper 82.

As illustrated in FIG. 9, two lens arrays, the lens arrays LA-1 and LA-2 are defined as the first lens array LA1 and the second lens array LA2, respectively. The second lens array LA2 is positioned between the first lens array LA1 and the condensing lens 822. The laser beam from the laser generator 81 passes through the first lens array LA1, the second lens array LA2, and the condensing lens 822 that have a common axis (i.e., a common optical axis), in this order. Of course, whereas the positions of the first lens array LA1 and the condensing lens 822 are fixed, the second lens array LA2 is provided in a manner that is movable along a section, in parallel with the third direction D-3 (refer to reference character D-3 in FIG. 2), of the beam traveling path. The lens drive mechanism 824 moves the second lens array LA2.

In FIG. 9, $f_1$ is the focal length of the first lens array LA1, $f_2$ is the focal length of the second lens array LA2, and $f_c$ is the focal length of the condensing lens 822. $d_{12}$ is the distance between the first lens array LA1 and the second lens array LA2. $d_{2c}$ is a distance between the second lens array LA2 and the condensing lens 822. $d_{ci}$ is the distance between the condensing lens 822 and the substrate. p is the pitch between the lenslets L. When performing a zoom operation in which the lens drive mechanism 824 moves the second lens array LA2, the distance $d_{12}$ between the first lens array LA1 and the second lens array LA2 and the distance $d_{2c}$ between the second lens array LA2 and the condensing lens 822 are changed. Accordingly, the inclination, the homogeneity, and the like of the flat top laser beam, along with the size of the image of the flat top laser beam reaching the lower surface of the substrate, are changed.

In this case, the size D of the image of the laser beam is calculated using the following Equation 5.

$$D = \frac{pf_c}{f_1 f_2}(f_1 + f_2 - d_{12}) \quad \text{[Equation 5]}$$

To process the image of the laser beam in such a manner that the image thereof has optimal inclination and homogeneity, an imaging condition has to be satisfied. The imaging condition is expressed as in the following Equation 6. When the second lens array LA2 is moved and then is positioned at a position that satisfies Equation 5, the flat top laser beam (that is, the overall uniform first beam B1) having the optimal inclination and homogeneity is provided. In contrast, when the second lens array LA2 is moved and then is positioned at a position that does not satisfy Equation 5, the flat top laser beam (that is, the edge-enhanced second beam B2) having the relatively low inclination and homogeneity is provided.

$$d_{12} = f_2 \quad \text{[Equation 6]}$$

When the imaging condition is satisfied, the size D of the image of the laser beam is calculated using Equation 7.

$$D = \frac{pf_c}{f_2} \quad \text{[Equation 7]}$$

In this manner, although instead of three lens arrays, two lens arrays are provided, one of the first beam B1 and the second beam B2 is selectively provided to the substrate.

Figure 10:
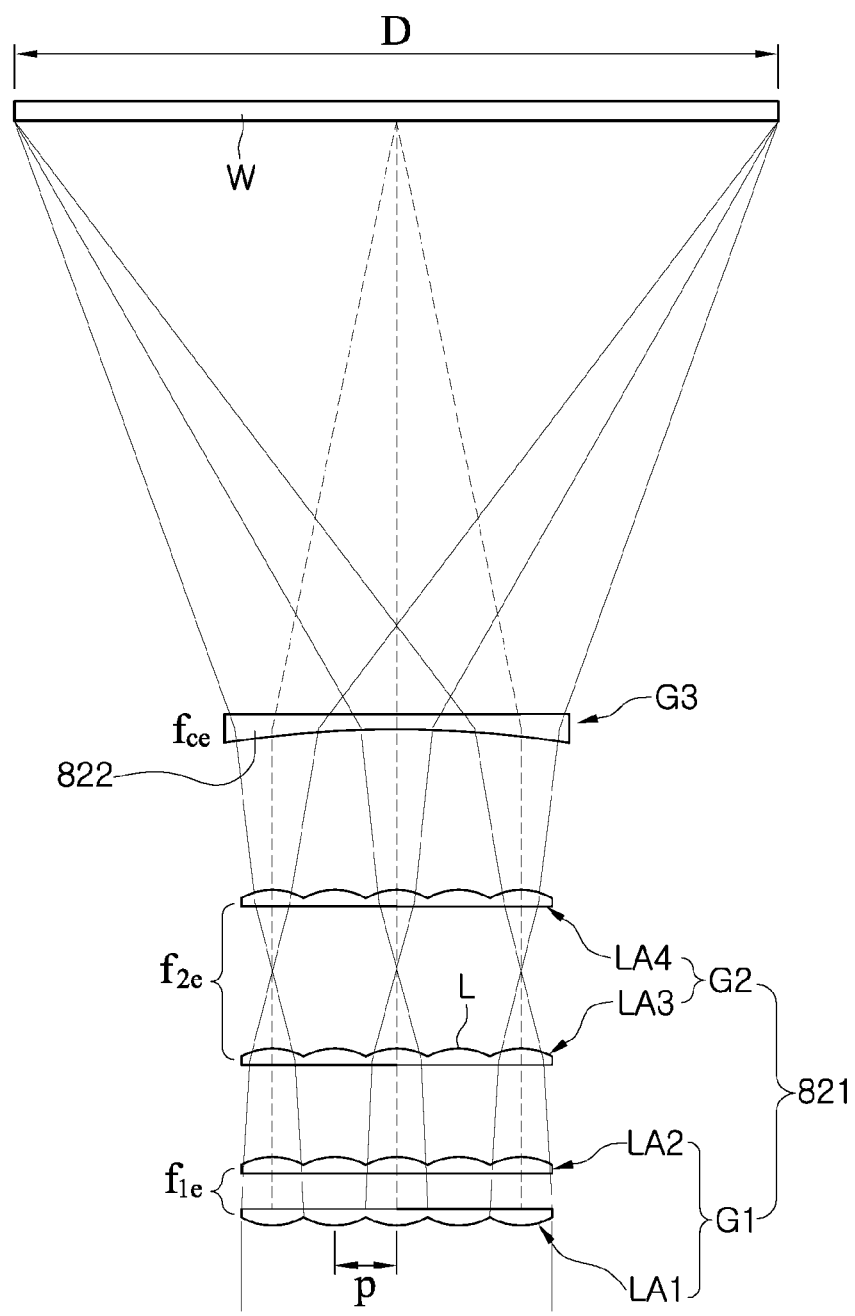
FIG. 10 is a view illustrating still another example of the substrate heating unit that constitutes the substrate processing apparatus according to the embodiment of the present disclosure;|
Figure 11:
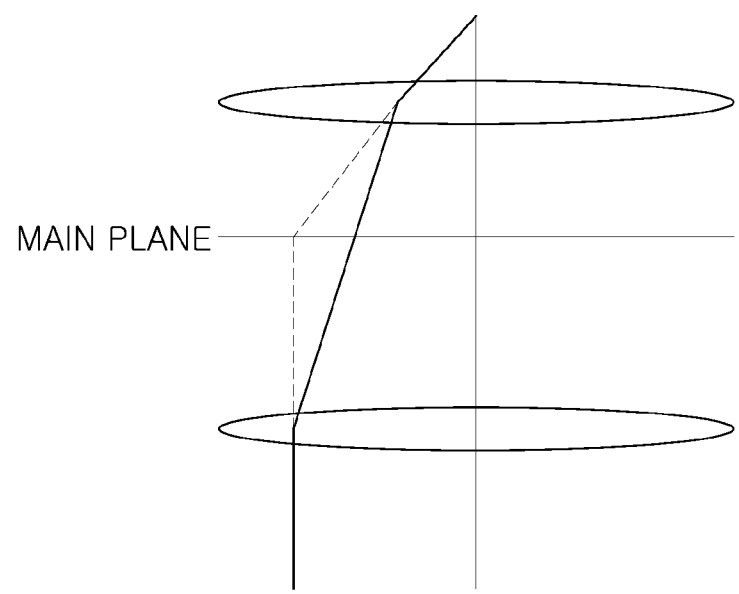
FIG. 11 is a reference view illustrating a main plane in association with the substrate heating unit in FIG. 10.
Figure 12:
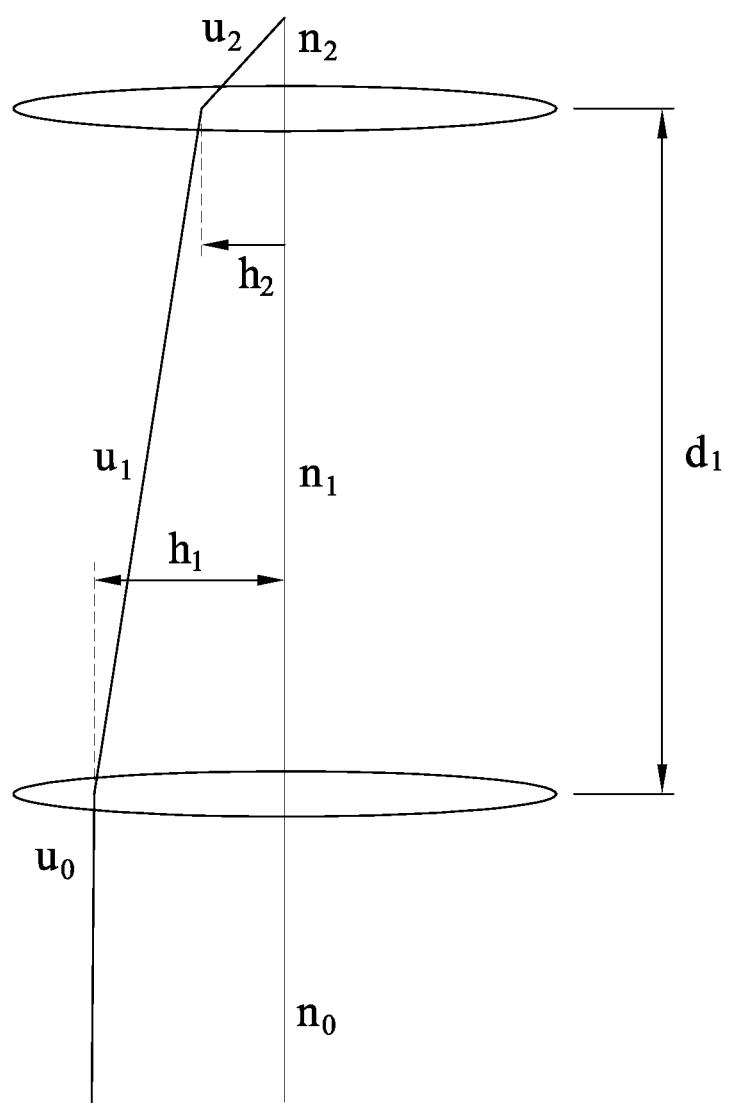
FIG. 12 is a reference view illustrating a state where the laser beam passing through lenses is reflected, in association with the substrate heating unit in FIG. 10.

FIG. 10 illustrates still another example of the substrate heating unit that finds application in the substrate processing apparatus according to the embodiment of the present disclosure. FIGS. 11 and 12 are reference views, each being associated with the example of the substrate heating unit in FIG. 10.

A difference of the example of the substrate heating unit in FIG. 10 from the above-described example of the substrate heating unit is that the lens assembly 821 includes a plurality of lenses arrays (for example, four or more lens arrays), lens arrays LA1, LA2, LA3, and LA4 and that at least one or more condensing lenses 822 are provided. For reference, FIG. 10 illustrates the example of the substrate heating unit with a focus on the beam shaper 82.

As illustrated in FIG. 10, the beam shaper 82 includes the lens assembly 821 and a condensing lens group G3. The lens assembly 821 includes a first lens array group G1 and a second lens array group G2. The first lens array group G1 has at least one more lens array, the lens arrays LA1 and LA2. The second lens array group G2 has at least one or more lens arrays, for example, the lens arrays LA3 and LA4. The condensing lens group G3 has at least one or more condensing lenses 822. The lens arrays LA1 and LA2 in the lens array groups G1 and G2 and the condensing lens 822 in the condensing lens group G3 are positioned along the beam traveling path in a manner that has a common axis. In an exemplary embodiment, the lens arrays LA1 and LA2 in the lens array groups G1 and G2 and the condensing lens 822 in the condensing lens group G3 are positioned along the common optical axis. The second lens array group G2 is positioned between the first lens array group G1 and the condensing lens group G3. The laser beam from the laser generator 81 passes through the first lens array group G1, the second lens array group G2, and the condensing lens group G3 in this order. At least one of the first lens array group G1 and the second lens array group G2 has a plurality of lens arrays.

A position of the foremost lens array LA1 with respect to the traveling direction of the laser beam is fixed, and at least one or more of the other lens arrays LA2, LA3, and LA4 are provided in a manner that is movable along a section, in parallel with the third direction D-3 (refer to reference character D-3 in FIG. 2), of the beam traveling path. In a case where the condensing lens group G3 has one condensing lens 822, a position of the condensing lens 822 is fixed. In a case where the condensing lens group G3 has a plurality of the condensing lenses 822, a position of the rearmost condensing lens 822 with respect to the traveling direction of the laser beam is fixed, and at least one or more of the other condensing lenses 822 may be provided in a manner that is movable along a section, in parallel with the third direction D-3, of the beam traveling path. Alternatively, all positions of the other condensing lenses 822 may be fixed. The movable lens array or the movable lens array group, and the movable condensing lens are moved by the lens drive mechanism 824.

In FIG. 10, $f_{1e}$ is an equivalent focal length of the first lens array group G1, $f_{2e}$ is an equivalent focal length of the second lens array group G2, and $f_{ce}$ is an equivalent focal length of the condensing lens group G3. p is the pitch between the lenslets L.

In this case, the size D of the image of the laser beam is calculated using the following Equation 8.

$$D = \frac{pf_{ce}}{f_{2e}} \quad \text{[Equation 8]}$$

A distance from a main plane of the first lens array group G1 to a main plane of the second lens array group G2 is the same as the equivalent focal distance $f_{2e}$ of the second lens array group G2. A zoom function is performed by changing the equivalent focal distance $f_{1e}$ of the first lens array group G1 and the equivalent focal distance $f_{2e}$ of the second lens array group G2.

With reference to FIG. 11, the main plane is defined as an imaginary plane that is perpendicular to a beam axis at points at which imaginary straight lines extending from the laser beams incident on the first lens array group G1, the second lens array group G2, and the condensing lens group G3 and an imaginary straight line extending from the emitted laser beam converge. In a case where a plurality of lenses (the lens arrays or the condensing lenses) are provided, this plurality of lenses are assumed to be one lens as the main plane.

The equivalent focal length is obtained when a focal length of the lens group (the lens array group or the condensing lens group) that is configured from a plurality of lenses is expressed as a focal length of one lens.

With reference to FIG. 12, when it is assumed that a refractive power of an i-th lens is $K_i$, a reflective index of the i-th lens is a distance between the i-th lens and an (i+1)-th lens is $d_i$, an angle between the laser beam incident on the i-th lens and the emitted laser beam is $u_i$, and a width (height) of the laser beam incident from the center point of the i-th lens is $h_i$, relationships as in the following Equations 9 and 10 are established.

$$n_i u_i - n_{i-1} u_{i-1} = -h_i K_i \quad \text{[Equation 9]}$$

$$h_i = h_{i-1} + d_{i-1} u_{i-1} \quad \text{[Equation 10]}$$

The focal length is expressed as a reciprocal of the refractive power.

$$f = \frac{1}{K} \quad \text{[Equation 11]}$$

Therefore, the equivalent focal length when one lens is present is expressed using the following Equation 12.

$$K = K_1 + K_2 - \frac{d K_1 K_2}{n_1} \quad \text{[Equation 12]}$$

In addition, the equivalent focal length when two lenses are present is expressed using the following Equation 13.

$$K = K_1 + K_2 + K_3 - A - B - C \quad \text{[Equation 13]}$$
$$A = \frac{d_1 (K_2 + K_3) K_1}{n_1}$$
$$B = \frac{d_2 (K_1 + K_2) K_3}{n_2}$$
$$C = \frac{d_1 d_2 K_1 K_2 K_3}{n_1 n_2}$$

The equivalent focal length when N lenses are present is expressed using the following Equation 14.

$$K = \frac{1}{h_1} \sum_{i=1}^{N} h_i K_i \quad \text{[Equation 14]}$$

Therefore, the equivalent focal length $f_{1e}$ of the first lens array group G1, the equivalent focal length $f_{2e}$ of the second lens array group G2, and the equivalent focal length $f_{ce}$ of the condensing lens group G3 are calculated using the above-mentioned equations. Accordingly, the size of the image of the laser beam reaching the lower surface of the substrate is calculated. To satisfy the imaging condition, the lenses are positioned in such a manner that the distance from the main plane of the first lens array group G1 to the main plane of the second lens array group G2 is the same as the equivalent focal length $f_{2e}$ of the second lens array group G2. The equivalent focal length $f_{1e}$ of the first lens array group G1, the equivalent focal length $f_{2e}$ of the second lens array group G2, and the equivalent focal length $f_{ce}$ of the condensing lens group G3 are positive numbers.

As described above, in still another example of the substrate heating unit, like in an example of the substrate heating unit and another example thereof, one of the first beam B1 (overall uniform beam) and the second beam B2 (edge-enhanced beam) is selectively emitted to the substrate. Furthermore, in still another example of the substrate heating unit, like in an example thereof, the size of the image of the laser beam is adjusted.

Although the specific embodiment of the present disclosure has been described for illustrative purposes, those skilled in the art will appreciate that various modifications, additions and substitutions are possible, without departing from the scope and spirit of the disclosure as disclosed in the accompanying claims.

What is claimed is:

1. A substrate heating unit comprising:
    a laser generator configured to generate a first laser beam which is directed toward a substrate; and
    a beam shaper configured to shape an energy distribution of the first laser beam received from the laser generator to selectively provide the substrate with a second laser beam having one of a uniform energy distribution over the substrate and an edge-enhanced energy distribution in which a first portion of the second laser beam is directed toward an edge portion of the substrate, and a second portion of the second laser beam is directed toward a central portion of the substrate, wherein the first portion of the second laser beam has an energy intensity higher than an energy intensity of the second portion of the second laser beam.

2. The substrate heating unit of claim 1,
    wherein the beam shaper comprises:
    a lens assembly configured to divide the first laser beam into a plurality of laser beams; and
    a condensing lens configured to converge the plurality of laser beams on the substrate,
    wherein the lens assembly is disposed between the laser generator and the condensing lens,
    wherein the lens assembly includes a first lens array and at least one second lens array,
    wherein the first lens array and the at least one second lens array are positioned such that an optical axis of the first lens array and an optical axis of the at least one second lens array are aligned with each other,
    wherein the first lens array is positioned at a fixed position and is closer to the laser generator than the at least on second lens array, and
    wherein the at least one second lens array is configured to be movable along the optical axis of the first lens array to generate the second laser beam having a circular shape with a diameter which is substantially the same as a diameter of the substrate.

3. The substrate heating unit of claim 2,
    wherein the beam shaper further comprises:
    a lens drive mechanism configured to move the at least one second lens array.

4. The substrate heating unit of claim 3, further comprising:
    a temperature detector configured to measure a distribution of temperature of the substrate; and
    a controller configured to control operation of the lens drive mechanism on the basis of the distribution of the temperature of the substrate.

5. The substrate heating unit of claim 2,
    wherein the at least one second lens array is provided between the first lens array and the condensing lens.

6. The substrate heating unit of claim 5,
    wherein the first lens array, the at least one second lens array, and the condensing lens are positioned such that an optical axis of the first lens array, the optical axis of the at least one second lens array, and an optical axis of the condensing lens are aligned with each other to a common optical axis.

7. The substrate heating unit of claim 5,
wherein the at least one second lens array includes a first movable lens array,
wherein the first movable lens array is controlled such that the first movable lens array is positioned at one of a first position that satisfies the following equation, and a second position that does not satisfy the following equation:

$$d_{12}=f_2, \quad \text{[Equation]}$$

where $d_{12}$ is a distance between the first lens array and the first movable lens array along the optical axis of the first lens array, and $f_2$ is a focal length of the first movable lens array.

8. The substrate heating unit of claim 2,
wherein the at least one second lens array comprises:
a first movable lens array that is provided between the first lens array and the condensing lens; and
a second movable lens array that is provided between the second lens array and the condensing lens.

9. The substrate heating unit of claim 8,
wherein the first lens array, the first movable lens array, the second movable lens array, and the condensing lens are positioned such that the optical axis of the first lens array, an optical axis of the first movable lens array, an optical axis of the second movable lens array, and an optical axis of the condensing lens are aligned with each other to a common optical axis.

10. The substrate heating unit of claim 8,
wherein the first movable lens array and the second movable lens array are controlled such that the first movable lens array is positioned at one of a first position that satisfies an equation 1, and a second position that does not satisfy the equation 1,
wherein the equation 1 is expressed as $$d_{12} = \frac{f_2(f_3 - d_{23})}{f_2 + f_3 - d_{23}},$$

where $d_{12}$ is a distance between the first lens array and the first movable lens array, $f_2$ is a focal length of the first movable lens array, and $f_3$ is a focal length of the second movable lens array, and
wherein the second movable lens array is positioned at one of a third position that satisfies an equation 2, and a fourth position that does not satisfy the equation 2, and
wherein the equation 2 is expressed as $$d_{23} = \frac{f_2 f_3 - d_{12}(f_2 + f_3)}{f_2 - d_{12}},$$

where $d_{23}$ is a distance between the first movable lens array and the second movable lens array.

11. The substrate heating unit of claim 2,
wherein each of the first lens array and the at least one second lens array includes a plurality of lenslets, and
wherein the plurality of lenslets are arranged to fill a region having a shape corresponding to a shape of the substrate.

12. A substrate processing apparatus comprising:
a substrate support unit configured to support a substrate and provided with an exposure opening through which a lower surface of the supported substrate is exposed; and
a substrate heating unit configured to heat the substrate supported by the substrate support unit,
wherein the substrate heating unit comprises:
a laser generator configured to generate a first laser beam which is directed toward a substrate; and
a beam shaper configured to shape an energy distribution of the first laser beam received from the laser generator to selectively provide the substrate with a second laser beam having one of a uniform energy distribution over the substrate and an edge-enhanced energy distribution in which a first portion of the second laser beam is directed toward an edge portion of the substrate, and a second portion of the second laser beam is directed toward a central portion of the substrate,
wherein the first portion of the second laser beam has an energy intensity higher than an energy intensity of the second portion of the second laser beam, and
wherein the second laser beam irradiates on the lower surface of the substrate through the exposure opening of the substrate support unit.

13. The substrate processing apparatus of claim 12,
wherein the beam shaper comprises:
a lens assembly configured to divide the first laser beam into a plurality of laser beams; and
a condensing lens configured to converge the plurality of laser beams on the substrate,
wherein the lens assembly comprises a plurality of lens arrays positioned along a common optical axis,
wherein the plurality of lens arrays includes at least one movable lens array which is configured to be movable along the common optical axis, and generate the second laser beam having a circular shape with a diameter which is substantially the same as a diameter of the substrate.

14. The substrate processing apparatus of claim 12, further comprising:
a distance adjustment unit configured to adjust a distance between the substrate and the beam shaper.

15. The substrate processing apparatus of claim 12,
wherein the substrate support unit comprises:
a head on which the substrate is provided, the head having the exposure opening therein; and
a substrate chuck coupled to the head,
wherein the substrate chuck includes a plurality of chuck pins on a top surface of the head and in the vicinity of the exposure opening, and
wherein the plurality of chuck pins are configured to support a lateral surface of the substrate.

16. The substrate processing apparatus of claim 15,
wherein the head comprises:
a head body provided with the exposure opening, the exposure opening extending from a bottom surface of the head body toward a top surface of the head body which corresponds to the top surface of the head; and
a support plate covering an upper end of the exposure opening,
wherein the support plate is made of a material transmitting the second laser beam and is provided with a plurality of support pins which are configured to support the lower surface of the substrate.

17. The substrate processing apparatus of claim 15,
wherein the head corresponds to a spin head that is rotated by a rotation drive unit and is vertically moved by an ascending/descending-enabling drive unit,
wherein the rotation drive unit comprises:
a head support member positioned under the spin head, which rotatably supports the spin head and has a beam passage in a vertical direction, the beam passage being connected to the exposure opening, and wherein the ascending/descending-enabling drive unit comprises:

a housing configured to support the head support member, the housing an opening on top, wherein the beam shaper is accommodated in the housing, wherein the opening of the housing is connected to the beam passage, and wherein the second laser beam of the beam shaper irradiates the lower surface of the substrate via the opening of the housing, the beam passage, and the exposure opening which are connected to each other; and a housing driver configured to ascend or descend the housing.

* * * * *